(12) United States Patent
Miyano et al.

(10) Patent No.: US 6,327,540 B1
(45) Date of Patent: Dec. 4, 2001

(54) METHOD OF DETECTING END POINT OF PROCESS, END POINT DETECTOR, COMPUTER MEMORY PRODUCT AND CHEMICAL MECHANICAL POLISHING APPARATUS

(75) Inventors: Takaya Miyano; Kiyoshi Miura; Kazuto Hasegawa; Yasuo Shirai, all of Osaka (JP)

(73) Assignee: Tokyo Electron Ltd., Tokyo (JP)

( * ) Notice: Subject to any disclaimer, the term of this patent is extended or adjusted under 35 U.S.C. 154(b) by 0 days.

(21) Appl. No.: 09/160,699

(22) Filed: Sep. 25, 1998

(30) Foreign Application Priority Data

Sep. 29, 1997 (JP) .................................................. 9-264635
Dec. 15, 1997 (JP) .................................................. 9-345504

(51) Int. Cl.[7] .................................................. G01R 15/00
(52) U.S. Cl. ........................... 702/57; 364/602; 364/604
(58) Field of Search .................................. 364/604, 602, 364/569; 702/57

(56) References Cited

U.S. PATENT DOCUMENTS

| 4,823,293 | * | 4/1989 | Oda ........................................ 364/604 |
| 5,222,329 | | 6/1993 | Yu . |
| 5,234,868 | | 8/1993 | Cote . |
| 5,245,794 | | 9/1993 | Salugsugan . |
| 5,308,438 | | 5/1994 | Cote et al. . |
| 5,337,015 | | 8/1994 | Lustig et al. . |
| 5,439,551 | | 8/1995 | Meikle et al. . |
| 5,667,424 | | 9/1997 | Pan . |
| 6,143,667 | * | 11/2000 | Marsh ................................ 438/740 |
| 6,149,761 | * | 11/2000 | Miyazaki et al. ................... 156/345 |
| 6,153,115 | * | 11/2000 | Le et al. .............................. 216/60 |

FOREIGN PATENT DOCUMENTS

A-8-306648    11/1996   (JP) .

* cited by examiner

Primary Examiner—John S. Hilten
Assistant Examiner—Charles H. Nolan, Jr.
(74) Attorney, Agent, or Firm—Barnes & Thornburg

(57) ABSTRACT

The invention provides a method of detecting an end point, an end point detector, a computer memory product and a chemical mechanical polishing apparatus, in which a physical quantity changing in accordance with proceeding of a process is measured, first time series data and second time series data delayed by a predetermined time from the first time series data are extracted on the basis of the measured Physical quantity, and the end point of the process is detected on the basis of correlation between the first time series data and the second time series data. Thus, the end point can be detected in a shorter period of time without previously performing plural tests.

22 Claims, 19 Drawing Sheets

METHOD OF DETECTING END POINT OF PROCESS, END POINT DETECTOR, COMPUTER MEMORY PRODUCT AND CHEMICAL MECHANICAL POLISHING APPARATUS

BACKGROUND OF THE INVENTION

The present invention relates to a method of detecting an end point of a process such as a manufacture process and a test process, a device to be used in the method, a computer memory product in which a computer program for executing the method is stored, and a chemical mechanical polishing apparatus provided with the device for detecting an end point of a process.

In the case where a semiconductor device such as a LSI and a VLSI is to be manufactured by using a wafer in which plural films are stacked on a silicon substrate, it is necessary to planarize the film surface of a desired layer in order to realize the higher circuit integration of the semiconductor device. The usage of a chemical mechanical polishing (hereinafter refereed to as the CMP) apparatus has been proposed for this purpose.

In a CMP apparatus, a polishing cloth impregnated with a polishing solution such as an alkaline colloidal silica solution is allowed to be in contact with the surface of a wafer with an appropriate force applied, and the polishing cloth is driven to be rotated, so that the film surface of the wafer can be planarized through composite functions of chemical etching using the alkaline solution and mechanical polishing using the colloidal silica. The end point of the polishing process by using the CMP apparatus has been conventionally detected by repeatedly measuring the thickness of the film with the CMP apparatus temporarily halted. Therefore, it disadvantageously takes a long time to planarize plural wafers. Accordingly, Japanese Patent Application Laid-Open No. 8-306648 (1996) discloses the following apparatus as a countermeasure.

FIG. 1 is a block diagram for showing the structure of an end point detector disclosed in Japanese Patent Application Laid Open No. 8-306648 together with the structure of a CMP apparatus. In FIG. 1, a reference numeral 32 denotes a polishing table in the shape of a bottomed cylinder. A polishing cloth 31 impregnated with a polishing solution is stretched over the opening of the polishing table 32, so as to be in contact with the surface of a wafer W in which plural films are stacked on a silicon substrate. At the center of the bottom of the polishing table 32, the output axis of a DC motor 34 is vertically provided. The DC motor 34 has power terminals 35 and 36, with the power terminal 36 connected with a positive terminal of a power supply 37 and the power terminal 35 connected with a negative terminal of the power supply 37 through a switch 38.

The power terminals 35 and 36 of the-DC motor 34 are also connected with an analyzer 41 for analyzing a frequency characteristic of an electric signal. The analyzer 41 analyzes a frequency characteristic of a noise signal appearing at the power terminals 35 and 36 of the DC motor 34, and supplies a result of the analysis to a level discriminating circuit 42. In the noise signal, different frequency components appear in accordance with the materials of the respective films of the wafer W.

In the level discriminating circuit 42, specific frequency components appearing in polishing the respective films of the wafer W by the CMP apparatus are previously set. The level discriminating circuit 42 generates time series data at levels of the specific frequency components on the basis of the results of the analysis supplied with time by the analyzer 41, detects the timing of a peak in the generated time series data, and supplies a peak detection signal to a control circuit 39. The control circuit 39 turns the switch 38 on in response to the peak detection signal, thereby halting the polishing of the wafer W by the CMP apparatus.

In the end point detector described in Japanese Patent Application Laid-Open No. 8-306648, however, the analysis of the frequency characteristic takes a long time because the frequency characteristic of the noise signal appearing at the power terminals of the DC motor is analyzed by the analyzer. Therefore, there arises a problem that the polishing speed of the CMP apparatus should be set low. Furthermore, it is necessary to previously determine the specific frequencies corresponding to the materials of plural films through tests to be previously set in the level discriminating circuit, which is disadvantageously troublesome. In addition, the analyzer for analyzing the frequency characteristic is disadvantageously expensive.

BRIEF SUMMARY OF THE INVENTION

The present invention was devised to overcome the aforementioned conventional problems, and the object of the invention is providing a method of detecting an end point of a process by which an end point can be detected in a shorter period of time at a lower cost without previously conducting plural tests; an end point detector used in the method; a computer memory product in which a computer program for the method is recorded; and a chemical mechanical polishing apparatus provided with the end point detector.

Specifically, in the method of this invention of detecting an end point of a process on the basis of time series data obtained by measuring, with time, a physical quantity changing in accordance with proceeding of the process, every time the time series data of a previously set time region are obtained, first time series data corresponding to a part of the time series data and second time series data delayed from the first time series data by a predetermined delay time are extracted from the time series data, correlation between the first time series data and the second time series data is calculated, and an end point of the process is discriminated on the basis of a result of calculation.

Furthermore, the device for detecting an end point of a process of this invention comprises a memory for storing the time series data; extracting means for extracting, from the memory, the first time series data and the second time series data; calculating means for calculating correlation between the first time series date and the second time series data; and discriminating means for discriminating an end point of the process on the basis of calculation by the calculating means.

Moreover, in the computer memory product of this invention is recorded a program including program code means for causing a computer to store the time series data in a memory; program code means for causing the computer to extract, from the memory, the first time series data and the second time series data; program code means for causing the computer to calculate correlation between the first time series data and the second time series data; and program code means for causing the computer to discriminate an end point of the process on the basis of a result of calculation.

Furthermore, the chemical mechanical polishing apparatus of this invention comprises a table for placing an object to be polished; a polishing table disposed to oppose the table and provided with a polishing cloth; a motor mounted on the table and/or the polishing table for causing a relative movement between the table and the polishing table; the device having the aforementioned structure for detecting an end point of a process in which a physical quantity changes in accordance with proceeding of the process; and control means for controlling the motor to halt chemical mechanical polishing when the device for detecting an end point detects the end point of the process.

According to the invention, the time series data are obtained by measuring with time the physical quantity changing in accordance with the proceeding of the process. For example, in the case where the invention is applied to a chemical mechanical polishing apparatus, in which the surface of a wafer is polished by contacting and moving the polishing cloth and the wafer relatively with supplying slurry, a current supplied to a motor for relatively moving the cloth and the wafer is periodically measured, thereby obtaining the time series data.

With plural time regions defined by dividing the time axis into a predetermined time duration, every time the time series data of one time region are obtained, the first time series data corresponding to a part of the time series data and the second time series data delayed from the first time series data by a predetermined delay time are extracted. And the extracted time series data are used for calculating correlation. When the correlation value exceeds a predetermined value, it is discriminated that the process is being proceeded in the time region. When the correlation value therebetween is smaller than the predetermined value, it is discriminated that the time region corresponds to the end point of the process.

In this manner, the end point is detected by using a comparatively easy algorithm without performing the frequency analysis, and hence, the end point can be detected in a short period of time and the device cost can be decreased. In addition, since the end point detection is conducted on the basis of the correlation between the first time series data and the second time series data, there is no need to previously perform, for example, plural tests on the respective materials of films, resulting in detecting the end point detection easily.

In the method of this invention of detecting an end point of a process, in addition to the aforementioned procedures, plural delay times are previously set with regard to one time region, plural pairs of the first time series data and the second time series data are extracted on the basis of the respective delay times, and correlations between the extracted pairs of the first time series data and the second time series data are obtained.

Furthermore, in the device of this invention for detecting an end point of a process, the extracting means extracts plural pairs of first time series data and second time series data on the basis of the respective delay times, and supplies the extracted first and second time series data to the calculating means.

Moreover, in the computer memory product of the invention, the program code means for causing the computer to extract the first time series data and the second time series data includes program code means for causing the computer to extract plural pairs of first time series data and second time series data on the basis of the respective delay times.

Accordingly, the plural pairs of the first time series data and the second time series data are extracted on the basis of the plural different delay times, and the correlations between respective pairs of the first time series data and the second time series data are obtained. Therefore, the thus obtained correlations can be statistically processed, resulting in improving the accuracy in the end point detection.

Furthermore, in the method of this invention of detecting an end point of a process, adjacent time regions overlap with each other.

Moreover, in the device of this invention for detecting an end point of a process, the extracting means extracts the first time series data and the second time series data with adjacent time regions overlapping with each other.

Furthermore, in the computer memory product of this invention, the program code means causes the computer to extract the first time series data and the second time series data with adjacent time regions overlapping with each other.

Accordingly, the plural time regions are defined so that, in two time regions adjacent to each other on the time axis, a predetermined portion in the vicinity of the end of the upstream time region can overlap with a predetermined portion in the vicinity of the beginning of the downstream time region. In the case where plural time regions are continuously set along the time axis, it is feared that an end point can be failed to be detected in the vicinity of the boundary between adjacent time regions. However, since the time regions are defined in the aforementioned manner, the failure in detecting an end point can be avoided.

Furthermore, in the method of this invention of detecting an end point of a process, a first value corresponding to a covariance of the first time series data and the second time series data is obtained as the correlation and the obtained first value is compared with a previously determined first threshold value, or a second value corresponding to an autocorrelation function is calculated by using the first value, so as to compare the second value with a previously determined second threshold value, Moreover, in the device of this invention for detecting an end point of a process, the calculating means includes means for obtaining a first value corresponding to a covariance of the first time series data and the second time series data, and the discriminating means includes means for comparing the first value with a previously determined first threshold value.

Alternatively, in the device of this invention for detecting an end point of a process, the calculating means includes means for obtaining a first value corresponding to a covariance of the first time series data and the second time series data; and means for calculating a second value corresponding to an autocorrelation function by using the first value, and the discriminating means includes means for comparing the second value with a previously determined second threshold value.

Furthermore, in the computer memory product of the invention is recorded a program including program code means for causing the computer to obtain a first value corresponding to a covariance of the first time series data and the second time series data, and program code means for causing the computer to compare the first value with a previously determined first threshold value.

Alternatively, in the computer memory product of the invention is recorded a program further including program code means for causing the computer to calculate a second value corresponding to an autocorrelation function by using the first value, and program code means for causing the computer to compare the second value with a previously determined second threshold value.

Accordingly, the covariance or the autocorrelation function of the first time series data and the second time series data is calculated, the first value obtained by calculating the covariance is compared with the first threshold value previously determined in accordance with the covariance, or the second value obtained by calculating the autocorrelation function is compared with the second threshold value previously determined in accordance with the autocorrelation function. Through the comparison of the value resulting from the calculation with the corresponding threshold value, for example, when the former is smaller than the latter, it is discriminated that there is no correlation therebetween and that the process has reached the end point. The aforementioned first and second threshold values are empirically obtained. Even when a wafer in which plural films are stacked on a substrate is to be polished by using a chemical mechanical polishing apparatus, each of the first and second threshold values is not obtained with regard to the materials of the respective films but can be defined as one value in the entire polishing process. Therefore, the end point detection can be less troublesome.

Furthermore, in the method of this invention of detecting an end point of a process, a first value corresponding to a covariance of the first time series data and the second time series data is calculated for obtaining the correlation, and the first value is compared respectively with a previously determined third threshold value and a fourth threshold value, which is smaller than the third threshold value, or alternatively, a second value corresponding to an autocorrelation function is calculated by using the first value, and the second value is compared respectively with a previously determined fifth threshold value and a sixth threshold value, which is smaller than the fifth threshold value. When the first value is larger than the third threshold value or the second value is larger than the fifth threshold value, a comparison result is stored, and when the first value is smaller than the fourth threshold value or the second value is smaller than the sixth threshold value, it is judged whether or not the comparison result is stored.

Moreover, in the device of this invention for detecting an end point of a process, the calculating means includes means for obtaining a first value corresponding to a covariance of the first time series data and the second time series data, and the discriminating means includes means for respectively comparing the first value with a previously determined third threshold value and a fourth threshold value, which is smaller than the third threshold value; means for storing a comparison result when the first value is larger than the third threshold value; and means for judging whether or not the comparison result is stored when the first value is smaller than the fourth threshold value.

Alternatively, in the device of this invention for detecting an end point of a process, the calculating means includes means for obtaining a first value corresponding to a covariance of the first time series data and the second time series data; and means for calculating a second value corresponding to an autocorrelation function by using the first value, and the discriminating means includes means for respectively comparing the second value with a previously determined fifth threshold value and a sixth threshold value, which is smaller than the fifth threshold value; means for storing a comparison result when the second value is larger than the fifth threshold value; and means for judging whether or not the comparison result is stored when the second value is smaller than the sixth threshold value.

Moreover, in the computer memory product of the invention is recorded a program including program code means for causing the computer to obtain a first value corresponding to a covariance of the first time series data and the second time series data; program code means for causing the computer to respectively compare the first value with a previously determined third threshold value and a fourth threshold value, which is smaller than the third threshold value; program code means for causing the computer to store a comparison result when the first value is larger than the third threshold value; and program code means for causing the computer to judge whether or not the comparison result is stored when the first value is smaller than the fourth threshold value.

Alternatively, in the computer memory product of the invention is recorded a program including program code means for causing the computer to obtain a first value corresponding to a covariance of the first time series data and the second time series data; program code means for causing the computer to calculate a second value corresponding to an autocorrelation function by using the first value; program code means for causing the computer to respectively compare the second value with a previously determined fifth threshold value and a sixth threshold value, which is smaller than the fifth threshold value; program code means for causing the computer to store a comparison result when the second value is larger than the fifth threshold value; and program code means for causing the computer to judge whether or not the comparison result is stored when the second value is smaller than the sixth threshold value.

In the case where a wafer on which plural films are stacked is to be polished by using a chemical mechanical polishing apparatus, the amount of a current supplied to a driving motor of the polishing apparatus is varied due to a resistance of a polished film while the film is being polished, and the amount of the current supplied to the driving motor decreases when a polished position comes closer to the boundary between the films because the resistance of the film decreases. When the polishing process proceeds to the boundary, the amount of the current supplied to the driving motor is minimized. After that, the amount of the current is retained substantially constant, and then the subsequent film is started to be polished, and hence, the amount of the current supplied to the driving motor gradually increases.

When the covariance or the autocorrelation function is calculated by using the time series data obtained by detecting the amount of this current, the first value or the second value increases to a maximum value in accordance with the proceeding of the process, then decreases to a minimum value, and increases thereafter again. Accordingly, the third threshold value and the fourth threshold value respectively corresponding to the larger and smaller threshold values determined in accordance with the covariance (the third threshold value>the fourth threshold value) or the fifth and sixth threshold values respectively corresponding to the larger and smaller threshold values determined in accordance with the autocorrelation function (the fifth threshold value>the sixth threshold value) are previously set, and a time point at which the first or second value becomes smaller than the smaller threshold value after exceeding the larger threshold value is detected as the end point of the process. The third through sixth threshold values are not obtained with regard to the materials of the respective films but can be defined in the entire polishing process. Therefore, the end point detection can be less troublesome.

The above and further objects and features of the invention will more fully be apparent from the following detailed description with accompanying drawings.

DETAILED DESCRIPTION OF THE INVENTION

The present invention will now be described with reference to the accompanying drawings illustrating the embodiments thereof.

Embodiment 1

Figure 1:
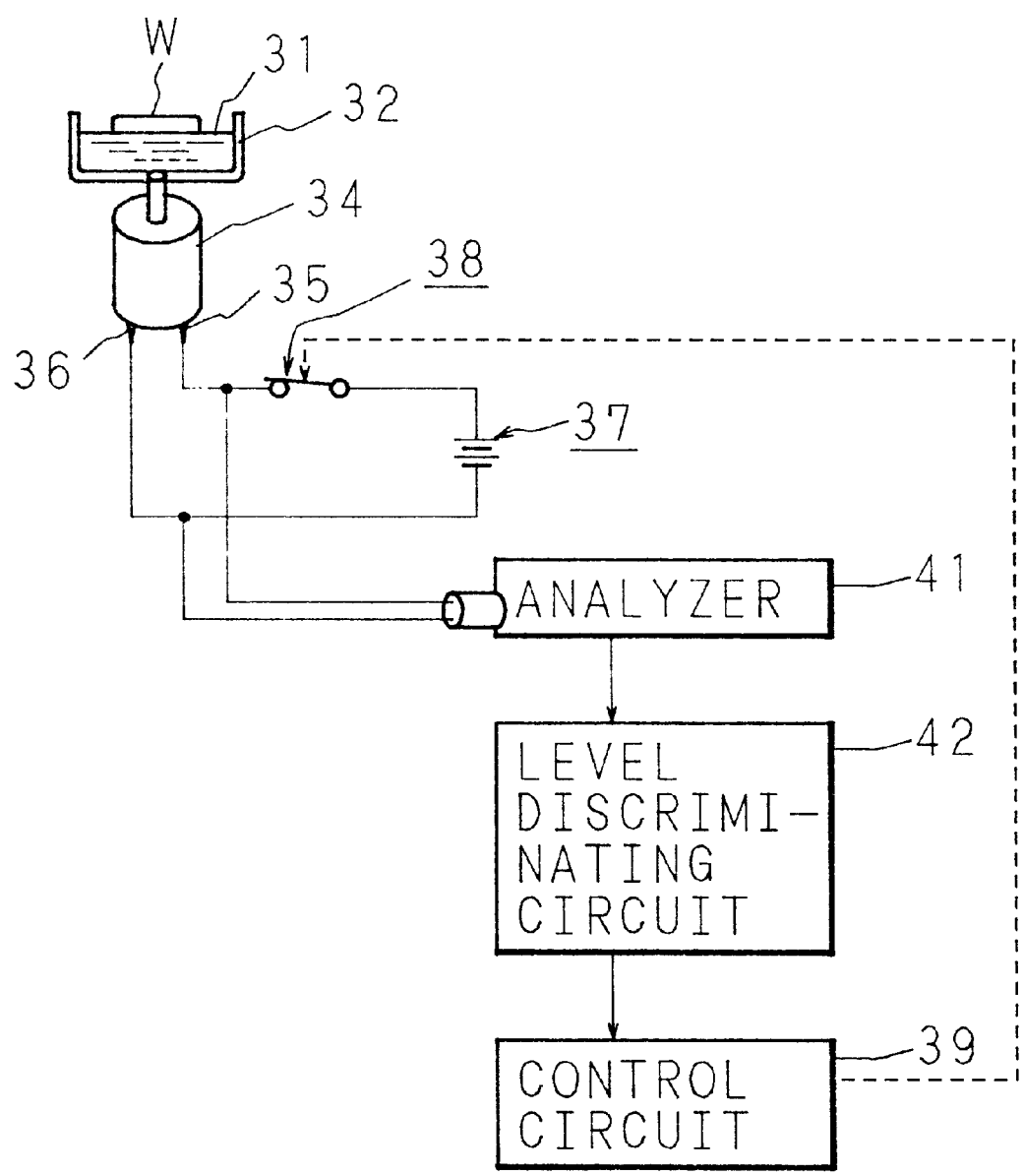
FIG. 1 is a block diagram for showing the structures of a conventional end point detector and a CMP apparatus.
Figure 2:
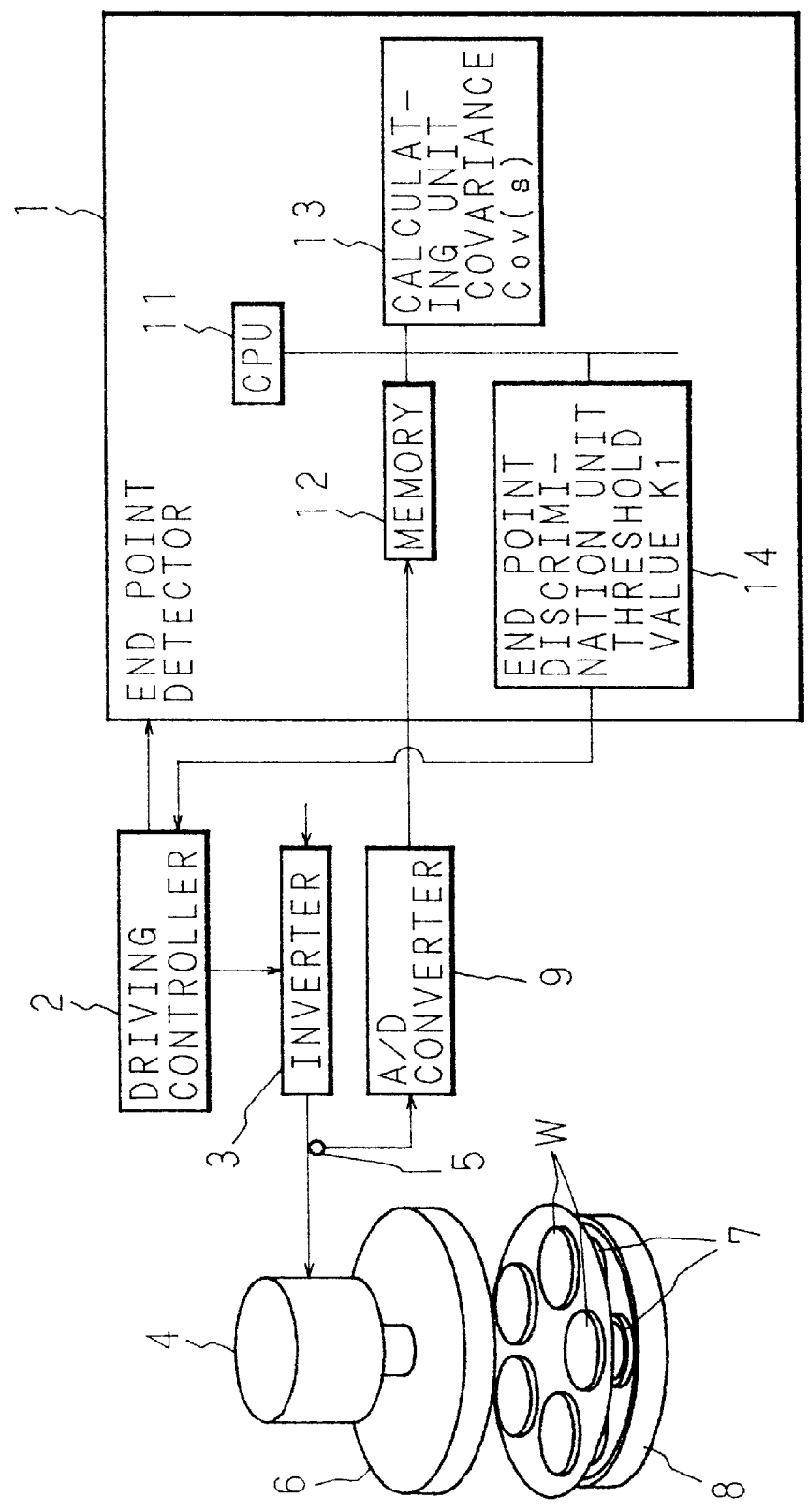
FIG. 2 is a block diagram for showing the structure of an end point detector according to the invention.

FIG. 2 is a block diagram for showing the structure of an end point detector according to a first embodiment of the invention, wherein a reference numeral 8 denotes a cylindrical base table provided to a CMP apparatus. The base table 8 can be ascended and descended by an elevator not shown. On the base table 8, plural electrostatic chucks 7, on which a table in the shape of a circle in a plan view is provided, are concentrically arranged and fixed. On the table on the electrostatic chucks 7, wafers W in each of which plural films are stacked on a silicon substrate are placed. Each wafer W is removably fixed on the electrostatic chuck 7 by using the electrostatic adsorption of the electrostatic chuck 7.

A cylindrical polishing table 6 is disposed above the wafers W, and a polishing cloth, which is impregnated with a polishing slurry such as an alkaline colloidal silica slurry, is fixedly stretched over the lower opening of the polishing table 6. The upper opening of the polishing table 6 is closed by a roof. At the center of the upper face of the roof, the output axis of a driving motor 4, such as an induction motor, is connected, so that the polishing table 6 can be driven to be rotated by the driving motor 4. The driving motor 4 is supplied with a driving current from an inverter 3. The inverter 3 is supplied with a pulse signal from a driving controller 2 for controlling the rotation drive of the driving motor 4. The driving controller 2 controls the driving speed of the driving motor 4 by adjusting a frequency of the driving current output by the inverter 3 through modulation of the pulse width of the pulse signal.

The inverter 3 is connected with an ammeter 5, and the ammeter 5 measures the driving current output from the inverter 3 and supplies the measurement result as a detection signal to an analog/digital (A/D) converter 9. The A/D converter 9 converts the analog signal supplied by the ammeter 5 into a digital signal at a predetermined cycle, and supplies the signal to an end point detector 1 for detecting end points of the polishing process. The driving current output by the inverter 3 changes in accordance with the change of torque of the driving motor 4, and hence, the change of the torque is supplied to the end point detector 1 as the change of the current.

The end point detector 1 is also supplied with a driving start signal from the driving controller 2. In response to the driving start signal, a CPU 11 of the end point detector 1 stores the detection signal supplied from the ammeter 5 in a memory 12 as time series data and actuates an calculating unit 13 described below. In the calculating unit 13, a standby time is previously set. The standby time herein means time required for proceeding the polishing process to a point at an appropriate depth in a layer directly above a target boundary among plural boundaries between the film layers of the wafer W determined on the basis of the polishing speed of the CMP apparatus and the thicknesses of the plural layers formed in the wafer W. The calculating unit 13 stands by until the standby time elapses from the receipt of the driving start signal. After the standby time elapses, every time the time series data of a previously set time region are written in the memory 12, the calculating unit 13 reads the stored time series data of that time region from the memory 12.

In the case where a wafer W on which plural films are stacked is to be polished by a CMP apparatus, a time point at which the wafer W has been polished to a boundary between the film layers can be one end point of the polishing process. In order to complete the polishing process with an appropriate boundary set as an end point, the calculating unit 13 stands by during the aforementioned standby time. Thus, the polishing process can be completed accurately at the target boundary regardless of irregularity in the thicknesses of the respective film layers.

Figure 3:
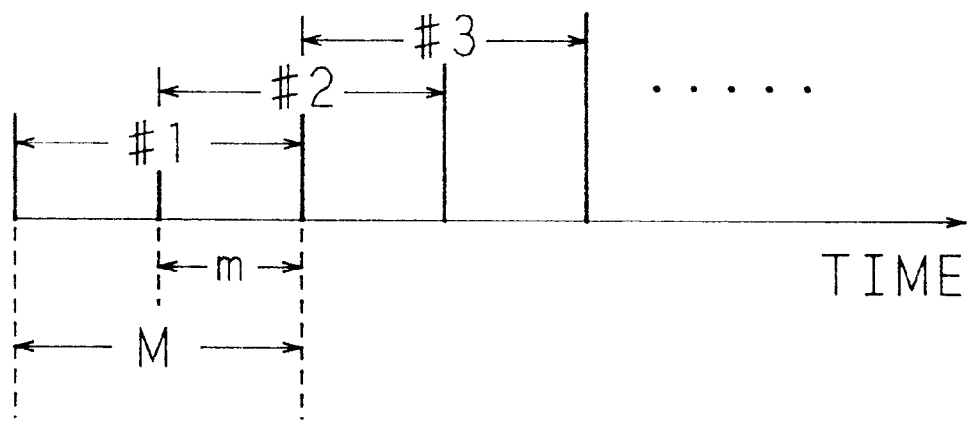
FIG. 3 is an explanatory diagram for showing a method of reading time series data from a memory by an operation unit of FIG. 2.

FIG. 3 is an explanatory diagram for showing how the calculating unit 13 of FIG. 2 reads the time series data from the memory 12, wherein the abscissa indicates time. A time duration of a predetermined time M after writing data in the memory 12 starts is defined as a first time region #1. The calculating unit 13 reads the time series data of the first time region #1 from the memory 12. Furthermore, a time duration of a predetermined time M from a time point earlier by a time m than the end of the first time region #1 is defined as a second time region #2. The calculating unit 13 reads the time series data of the second time region #2 from the memory 12. Thus, these procedures are repeated, so that time series data of a third time region #3, time series data of a fourth time region #4, etc. can be successively read. In this manner, the respective time regions #1, #2, etc. overlap with each other by the time m, and hence, the end point of the process can be prevented from being failed to be detected.

In the calculating unit 13, plural delay times T (=$T_1$, $T_2$, etc.) are previously set. The delay time T means a time difference between the leading data of first time series data and second time series data. The calculating unit 13 extracts, for example, N (=$N_1$, $N_2$, etc.) data obtained between a time 0 and a time (M−T) in the first time region #1, and defines the extracted N data as first time series data x(t). Also, the calculating unit 13 extracts N data obtained between a time T and a time M in the first time region #1, and defines the extracted N data as second time series data x (t+T). In this embodiment, N data counted from the leading data of the time series data are extracted as the first time series data and N data counted from the last data of the time series data are extracted as the second time series data, which does not limit the invention. The first time series data and the second time series data are part of the time series data read from the memory 12, and can be extracted as data groups each including the same number of data with a time difference of the delay time T between the leading data of the respective data groups. In the calculating unit 13, the following formula (1) is previously set, and the calculating unit 13 substitutes the first time series data x(t) and the second time series data x(t+T) in the formula (1). The first time series data and the second time series data are extracted with regard to respective delay times $T_1$, $T_2$, etc., so that the calculating unit 13 can calculate a covariance Cov(s) corresponding to each of the delay times and calculate an average of the thus obtained plural covariances Cov(s). Then, the calculating unit 13 supplies the obtained average to an end point discrimination unit 14.

Formula (1):

In the end point discrimination unit 14, a first threshold value $K_1$ determined in accordance with the covariance Cov(s) is previously set, so that the end point discrimination unit 14 can compare the supplied average with the first threshold value $K_1$. When the average is smaller than the first threshold value $K_1$, the end point discrimination unit 14 determines that there is a negative correlation or no correlation between the first time series data and the second time series data, discriminates that the polishing process has reached a boundary between the layers of the wafer W, and sets EDP (end point detection) at 0 in that time region. When the average is larger than the threshold value $K_1$, the end point discrimination unit 14 determines that there is a positive correlation between the first time series data and the second time series data, discriminates that a film in the wafer W is being polished in the polishing process, and sets the EDP at 1 in that time region.

Furthermore, in order to prevent error discrimination derived from the irregularity in the thicknesses of the films, the end point discrimination unit 14 judges whether or not the EPD is set at 0 in adjacent two time regions. When the EPD is set at 0 in the adjacent two time regions, the end point discrimination unit 14 supplies a driving halt instruction to the driving controller 2, thereby halting the operation of the driving motor 4. On the other hand, when the EPD is not set at 0 in the adjacent two time regions, the end point discrimination unit 14 does not supply the driving halt instruction to the driving controller 2, and repeats the aforementioned end point discrimination with the polishing process continued. Thereafter, when it is determined that the EPD is set at 0 in the adjacent two regions, the end point discrimination unit 14 supplies the driving halt instruction to the driving controller 2. In this manner, regardless of the irregularity in the thicknesses of the films, the polishing process can be accurately completed at the target boundary.

Figure 4:
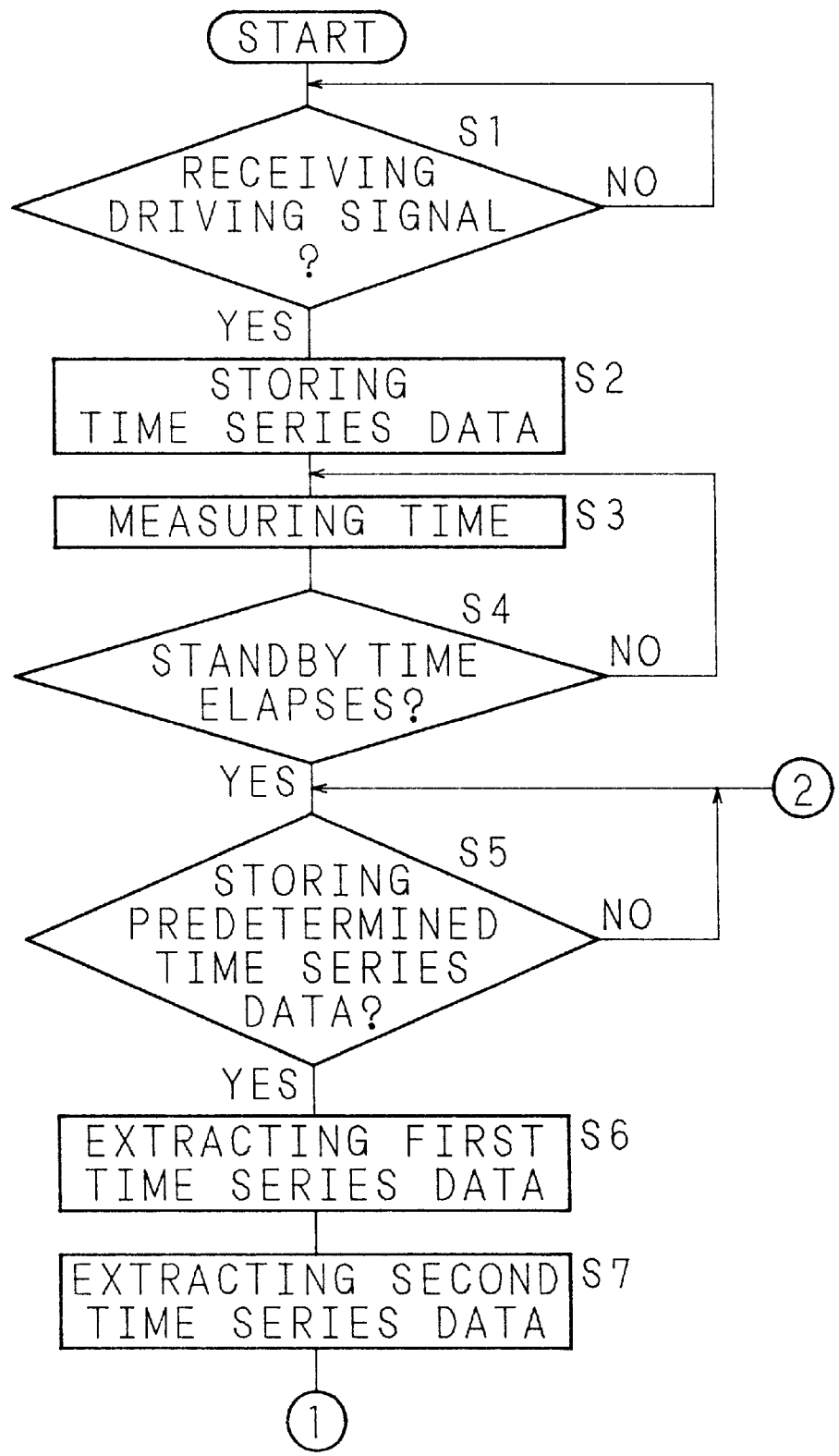
FIGS. 4 and 5 are flowcharts for showing procedures in detection of an end point of a process by the end point detector of FIG. 2.
Figure 5:
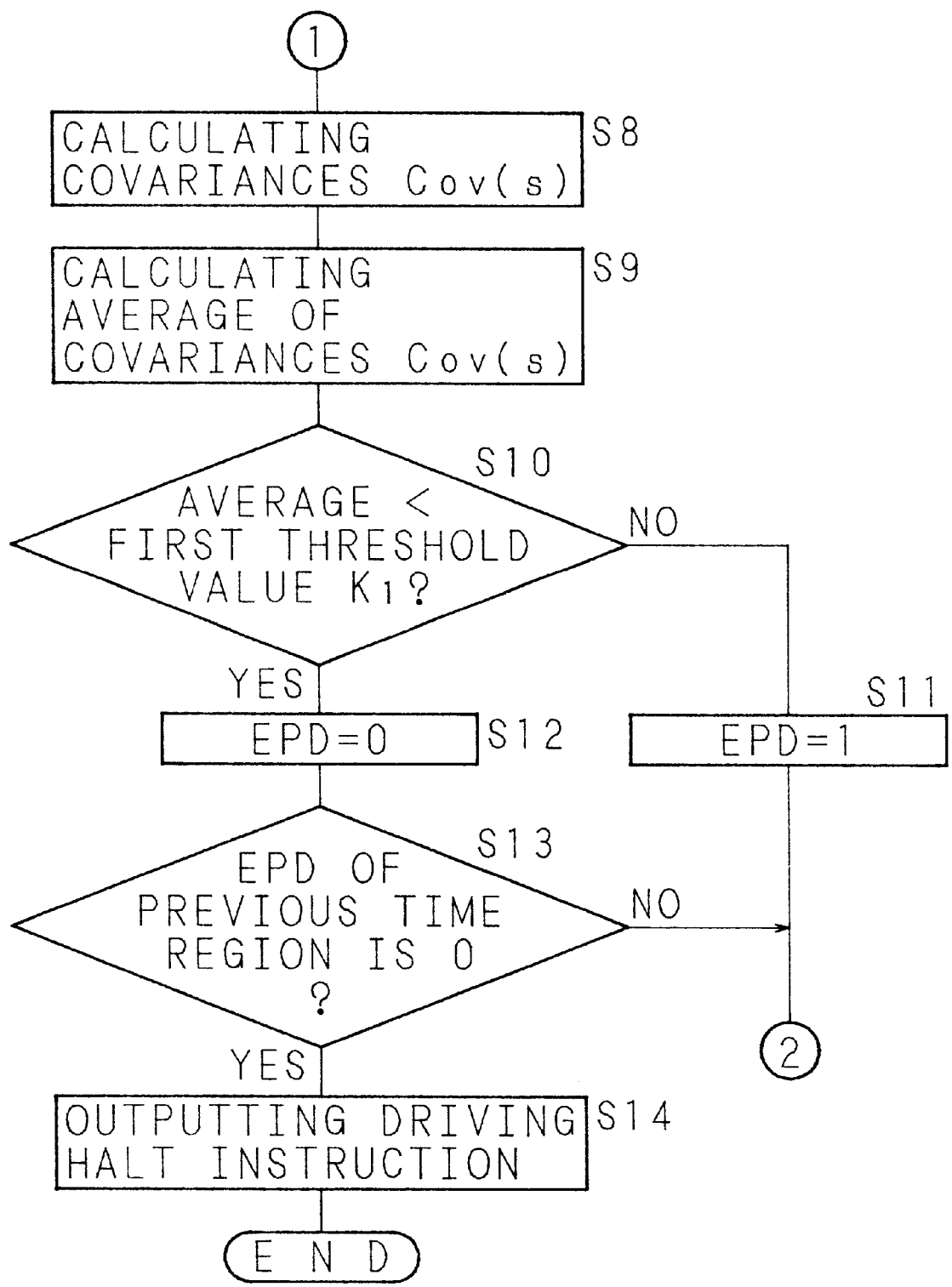

FIGS. 4 and 5 are flowcharts for showing the procedures in the detection of an end point of a process by the end point detector 1 of FIG. 2. The CPU 11 of the end point detector 1 is placed in standby until the receipt of the driving start signal from the driving controller 2 (step Si), and when the driving start signal is supplied, the CPU 11 stores the detection signal supplied from the ammeter 5 in the memory 12 as the time series data (step S2) and actuates the calculating unit 13.

The calculating unit 13 starts measuring time from the supply of the driving start signal (step S3), and stands by until the predetermined standby time elapses (step S4). After the calculating unit 13 judges that the standby time has elapsed, it judges whether or not the time series data of a previously set time region have been stored in the memory 12 (step S5). When the time series data of the time region have been stored in the memory 12, the calculating unit 13 reads the time series data from the memory 12. The calculating unit 13 extracts N (=$N_1$, $N_2$, etc.) data obtained between the time 0 and the time (M−T) from the time series data read from the memory 12 as the first time series data x(t), and extracts N data obtained between the time T and the time M from the read time series data as the second time series data x(t+T) (steps S6 and S7).

Then, the calculating unit 13 substitutes the first time series data x(t) and the second time series data x(t+T) in the formula (1), calculates the covariances Cov(s) of the delay times $T_1$, $T_2$, etc., calculates the average of the obtained covariances Cov(s) (steps S8 and S9), and supplies the average to the end point discrimination unit 14. The end point discrimination unit 14 judges whether or not the average is smaller than the first threshold value $K_1$ (step S10). When the average is equal to or larger than the first threshold value $K_1$, the EPD is set at 1 in this time region (step S11), and the procedure returns to the step S5. In the procedure in the step S5, the first and second time series data of a subsequent time region are obtained, and the procedures from the step S5 to the step S10 are repeated by using time series data extracted in respective subsequent time regions until the average is judged to be smaller than the first threshold value $K_1$ in the step S10.

When the average is judged to be smaller than the first threshold value $K_1$ in the step S10, the end point discrimination unit 14 sets the EPD at 0 in this time region (step S12). The end point discrimination unit 14 refers the value of the EPD set in a previous time region and judges whether or not the EPD of the previous time region is 0 (step S13). When the EPD is not 0, the procedure returns to the step S5, and the procedures from the step S5 to the step S13 are repeated with regard to subsequent time regions until the EPD set in a previous time region is judged to be 0 in the step S13. When the EPD set in the previous time region is judged to be 0 in the step S13, the end point discrimination unit 14 outputs the driving halt instruction to the driving controller 2 (step S14).

Embodiment 2

Figure 6:
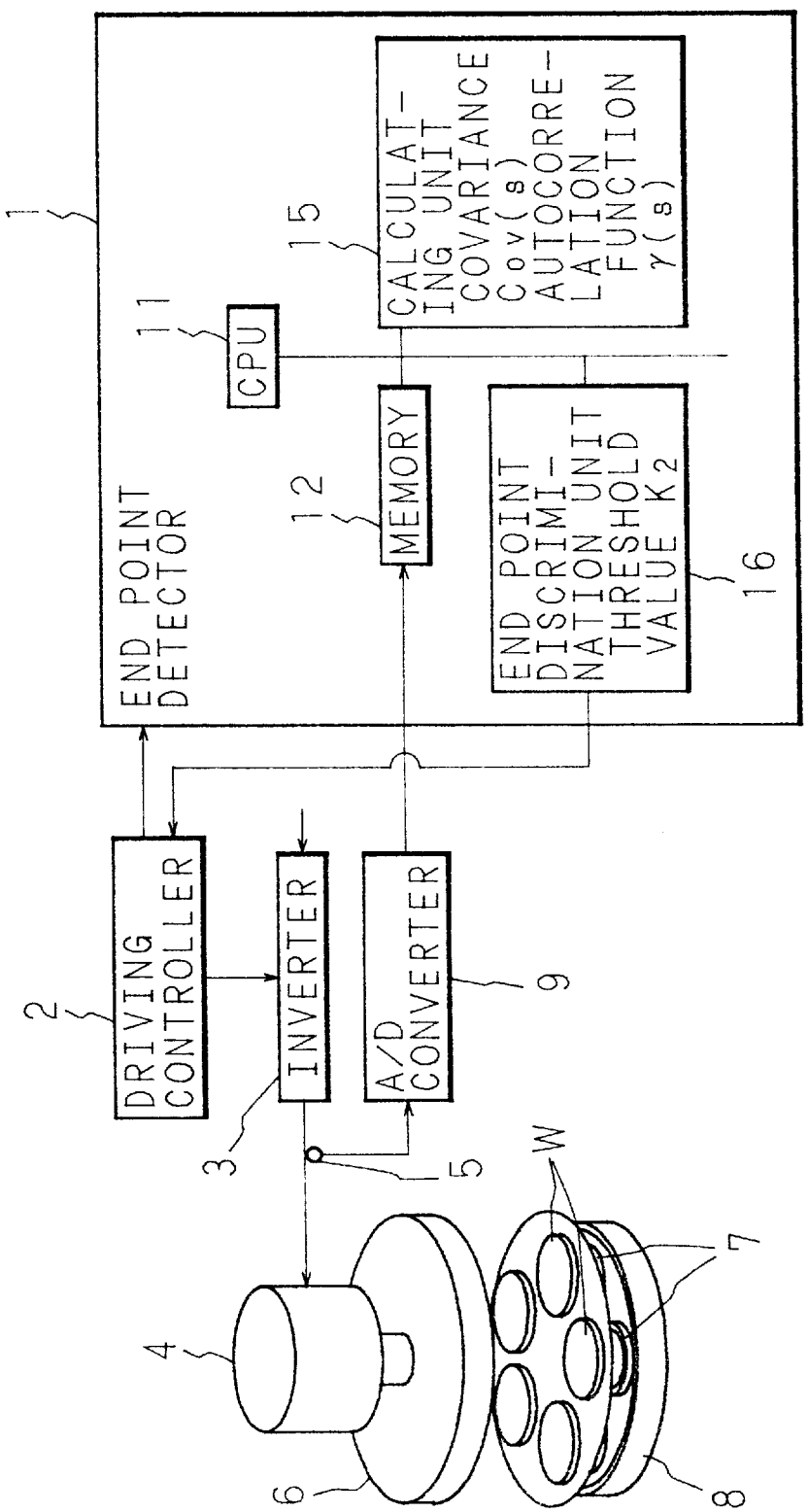
FIG. 6 is a block diagram of an end point detector according to a second embodiment of the invention.
Figure 7:
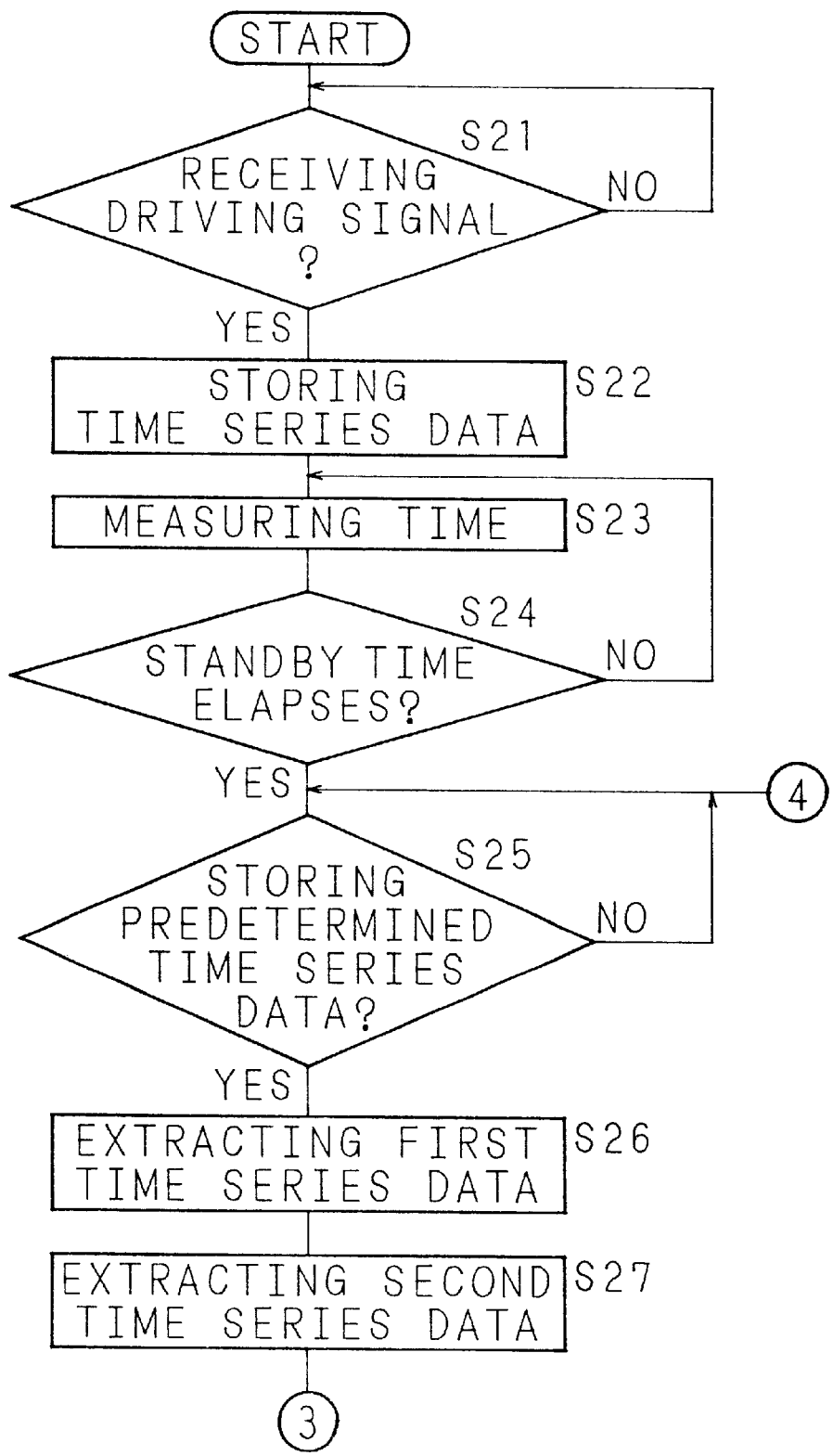
FIGS. 7 and 8 are flowcharts for showing procedures in detection of an end point of a process by the end point detector of FIG. 6.
Figure 8:
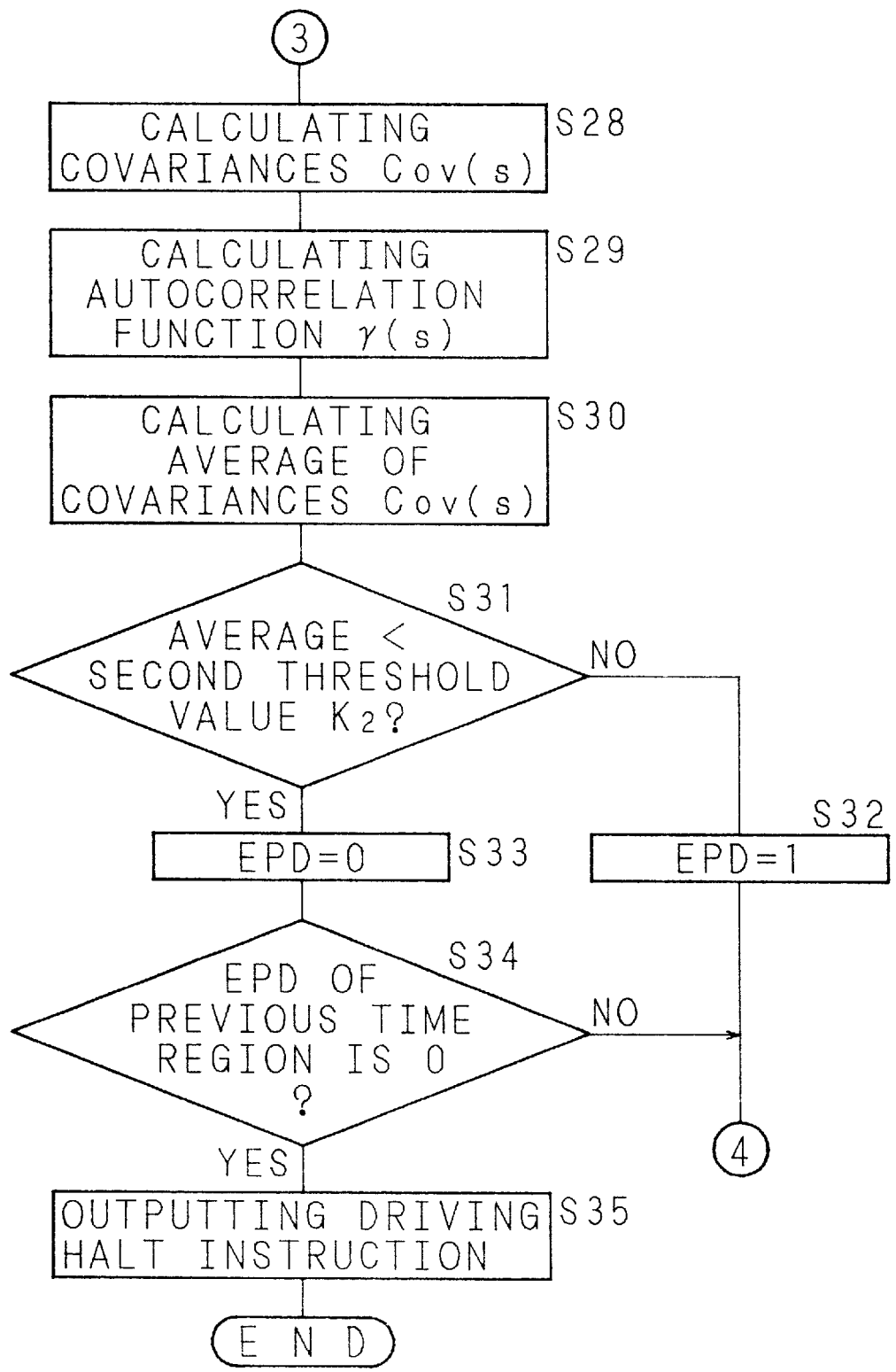

FIG. 6 is a block diagram for showing a second embodiment of the invention, in which the correlation between first time series data and second time series data is obtained not by using the covariance but by using an autocorrelation function. FIGS. 7 and 8 are flowcharts for showing procedures in the detection of an end point of a process by using an end point detector 1 shown in FIG. 6. In FIG. 6, like reference numerals are used to refer to like elements shown in FIG. 2, and the description is omitted. The CPU 11 of the end point detector 1 is placed in standby until the supply of a driving start signal from the driving controller 2 (step S21), and when the driving start signal is supplied, the CPU 11 stores a detection signal supplied from the ammeter 5 in the memory 12 as time series data (step S22) and actuates an calculating unit 15.

The calculating unit 15 starts measuring time from the supply of the driving start signal and stands by until a predetermined standby time elapses (steps S23 and S24). After the calculating unit 15 judges that the standby time has elapsed, the calculating unit 15 determines whether or not time series data of a previously set time region have been stored in the memory 12 (step S25). When the time series data of the time region have been stored in the memory 12, the calculating unit 15 reads the time series data from the memory 12. The calculating unit 15 extracts N ($=N_1, N_2$ etc.) data obtained between a time 0 and a time (M−T) from the time series data read from the memory 12 as first time series data $x(t)$, and extracts N data obtained between a time T and a time M from the read time series data as second time series data $x(t+T)$ (steps S26 and S27).

The calculating unit 15 substitutes the first time series data $x(t)$ and the second time series data $x(t+T)$ in the formula (1), and calculates the covariances Cov(s) corresponding to the delay times $T_1$, $T_2$, etc. (step S28). Then, the calculating unit 15 substitutes the obtained covariances Cov(s) in the following formula (2) so as to obtain autocorrelation functions $\gamma(s)$, calculates an average of the thus obtained plural autocorrelation functions $\gamma(s)$ (steps S29 and S30), and supplies the average to an end point discrimination unit 16.

Formula (2):

In the end point discrimination unit 16, a second threshold value $K_2$ determined in accordance with the autocorrelation function $\gamma(s)$ is previously set, so that the end point discrimination unit 16 can judge whether or not the average of the autocorrelation functions $\gamma(s)$ is smaller than the second threshold value $K_2$ (step S31). When the average of the autocorrelation functions $\gamma(s)$ is equal to or larger than the second threshold value $K_2$, the end point discrimination unit 16 sets the EPD at 1 in this time region (step S32), and the procedure returns to the step S25. In the procedure in the step S25, first and second time series data of a subsequent time region are obtained, and the procedures from the step S25 to the step S31 are repeated by using time series data of subsequent time regions until the average of the autocorrelation functions $\gamma(s)$ is judged to be smaller than the second threshold value $K_2$ in the step S31.

When the average of the autocorrelation functions $\gamma(s)$ is judged to be smaller than the second threshold value $K_2$ in the step S31, the end point discrimination unit 16 sets the EPD at 0 in this time region (step S33). The end point discrimination unit 16 refers the value of the EPD set in a previous time region and judges whether or not the EPD in the previous time region is 0 (step S34). When the EPD is not 0, the procedure returns to the step S25, and the procedures from the step S25 to the step S31 are repeated with regard to subsequent time regions until the EPD set in a previous time region is judged to be 0 in the step S34. When the EPD set in a previous time region is judged to be 0 in the step S34, the end point discrimination unit 16 outputs a driving halt instruction to the driving controller 2 (step S35). The end point detection by using the autocorrelation function $\gamma(s)$ in this manner is superior to the end point detection by using the aforementioned covariance Cov(s) because the detection does not depend upon the intensity of the signals measured as the data and can be judged on the basis of a standard value.

Embodiment 3

Figure 9:
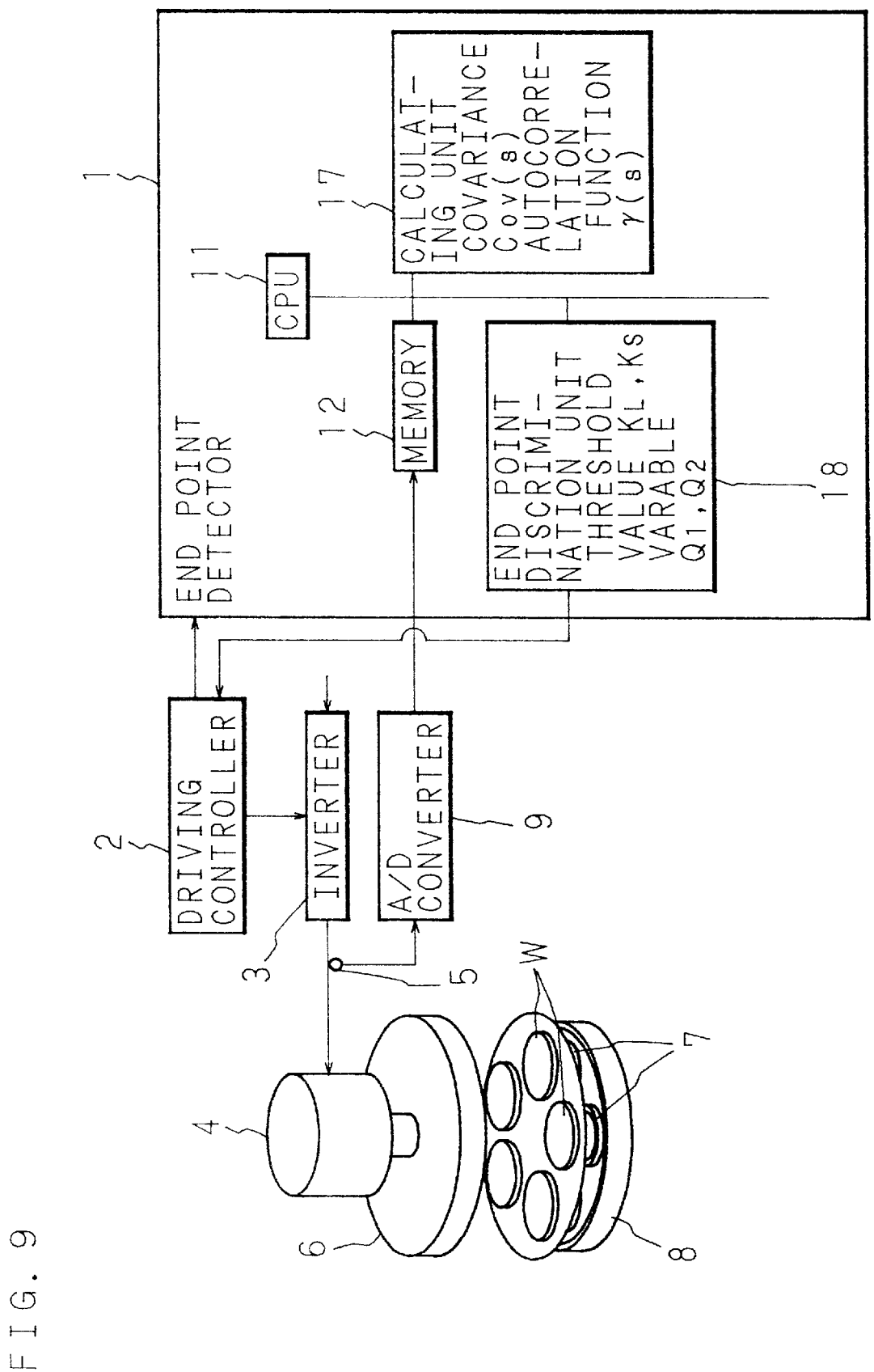
FIG. 9 is a block diagram of an end point detector according to a third embodiment of the invention.
Figure 10:
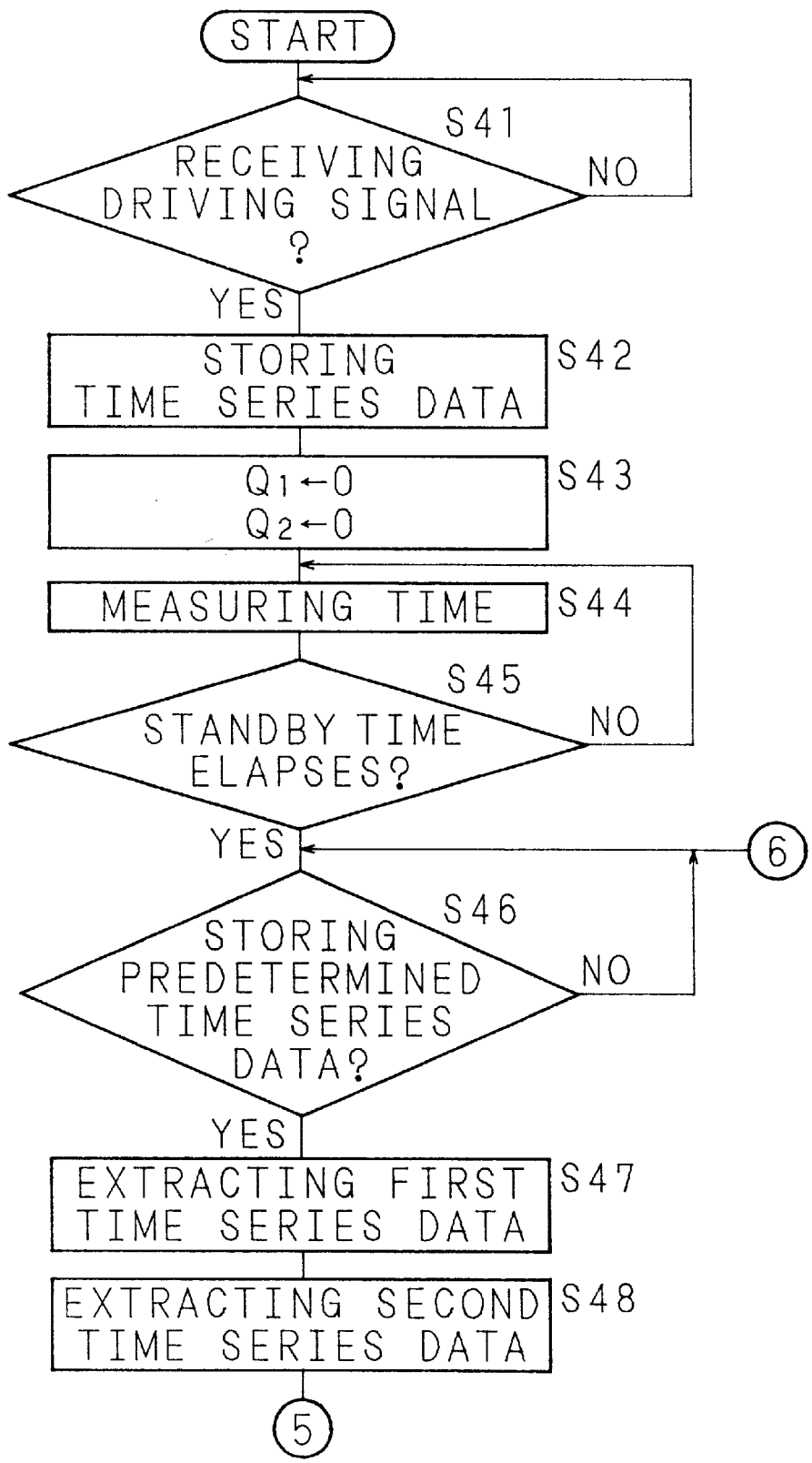
FIGS. 10 and 11 are flowcharts for showing procedures in detection of an end point of a process by the end point detector of FIG. 9.
Figure 11:
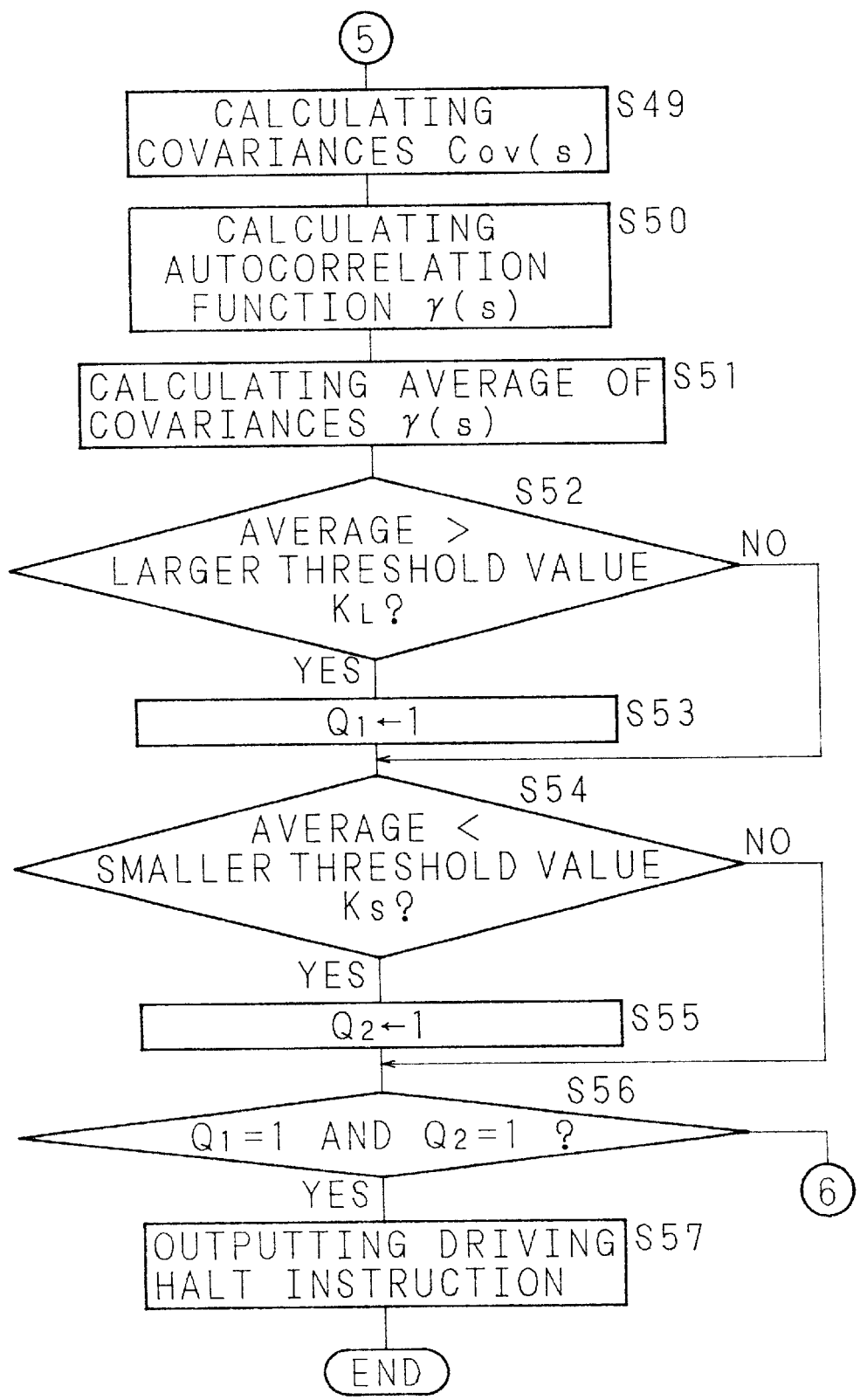

FIG. 9 is a block diagram for showing a third embodiment of the invention, and FIGS. 10 and 11 are flowcharts for showing procedures in the detection of an end point of a process by using an end point detector 1 shown in FIG. 9. In FIG. 9, like reference numerals are used to refer to like elements shown in FIG. 2, and the description is omitted. In this embodiment, an end point of a process is detected on the basis of the following phenomenon:

In the case where a wafer W on which plural films are stacked is to be polished by using the polishing table 6 of the CMP apparatus, while each film is being polished, the amount of a current supplied to the driving motor 4 is varied due to the resistance of the polished film, so that the amount of the current supplied to the driving motor 4 can decrease as the polishing process proceeds to be closer to a boundary between the films because the resistance of the film is decreased. The polishing process proceeds to the boundary with the amount of the current supplied to the driving motor 4 minimized, and then the current value is retained substantially constant. After this constant state, the polishing process proceeds to a subsequent film, and hence, the amount of the current supplied to the driving motor 4 gradually increases.

Accordingly, when the covariance Cov(s) and the autocorrelation function $\gamma(s)$ are calculated on the basis of the time series data detected by the ammeter 5 as described above, the covariance Cov(s) and the autocorrelation function $\gamma(s)$ increase to maximum values, decrease to minimum values and then increase again in accordance with the proceeding of the polishing process. Therefore, two threshold values (a larger threshold value $K_L$ and a smaller threshold value $K_S$; $K_L > K_S$) are previously set in accordance with the covariance Cov(s) or the autocorrelation function $\gamma(s)$, so as to detect a point where the covariance Cov(s) or the autocorrelation function $\gamma(s)$ becomes smaller than the smaller threshold value $K_S$ after exceeding the larger threshold value $K_L$. Thus, an end point of a process can be detected.

The CPU 11 of the end point detector 1 is placed in standby until the supply of a driving start signal from the driving controller 2 (step S41), and in response to the driving start signal, the CPU 11 stores a detection signal supplied from the ammeter 5 in the memory 12 as time series data (step S42) and actuates an calculating unit 17 and an end point discrimination unit 18. The end point discrimination unit 18 sets end point discrimination variables $Q_1$ and $Q_2$ described below at 0 (step S43).

The calculating unit 17 starts measuring time after the supply of the driving start signal, and stands by until a predetermined standby time elapses (steps S44 and S45). After the calculating unit 17 judges that the standby time has elapsed, the calculating unit 17 judges whether or not time series data of a previously set time region have been stored in the memory 12 (step S46). When the time series data of the time region have been stored in the memory 12, the calculating unit 17 reads the time series data from the memory 12. The calculating unit 17 extracts N ($=N_1, N_2$ etc.) data obtained between a time 0 and a time (M−T) from the time series data read from the memory 12 as first time series data $x(t)$, and extracts N data obtained between a time T and a time M from the read time series data as second time series data $x(t+T)$ (steps S47 and S48).

The calculating unit 17 substitutes the first time series data $x(t)$ and the second time series data $x(t+T)$ in the formula (1) and calculates covariances Cov(s) corresponding to the delay times T1, T2, etc. (step S49). The calculating unit 17 substitutes the thus obtained covariances Cov(s) in the formula (2) so as to obtain autocorrelation functions $\gamma(s)$, calculates an average of the thus obtained plural autocorrelation functions γ(s) (steps S50 and S51), and supplies the average to the end point discrimination unit 18.

In the end point discrimination unit 18, the larger threshold value $K_L$ and the smaller threshold value $K_S$ ($K_L > K_S$) are previously set, so that the end point discrimination unit 18 can judge whether or not the average of the autocorrelation functions γ(s) is larger than the larger threshold value $K_L$ (step S52). When the average is larger than the larger threshold value $K_L$, the end point discrimination unit 18 sets the end point discrimination variable $Q_1$, at 1 (step S53), and then judges whether or not the average of the autocorrelation functions γ(s) is smaller than the smaller threshold value $K_s$ (step S54). When the average of the autocorrelation functions γ(s) is equal to or smaller than the larger threshold value $K_L$, the procedure proceeds to a step S54 with a step S53 skipped.

When the average of the autocorrelation functions γ(s) is judged to be smaller than the smaller threshold value $K_S$ in the step S54, the end point discrimination unit 18 sets the end point discrimination variable $Q_2$ at 1 (step S55), and then judges whether or not the end point discrimination variables $Q_1$, and $Q_2$ are both 1 (step S56). The procedures from the step S46 to the step S56 are repeated by using first and second time series data extracted in subsequent time regions until the end point discrimination unit 18 judges $Q_2$ is set at 1 after $Q_1$ is set at 1. When the end point discrimination unit 18 judges that $Q_1$ and $Q_2$ are both set at 1 in the step S56, it outputs a driving halt instruction to the driving controller 2 (step S57).

In each of the aforementioned embodiments, the device for detecting an end point of a process is applied to the CMP apparatus, which does not limit the invention. The end point detector can be applied to, for example, a plasma processor. In this case, the time series data are obtained by measuring with time luminance intensity from a material to be plasma-processed, so that an end point of the process can be detected by using the thus obtained time series data in the same manner as described above.

Figure 12:
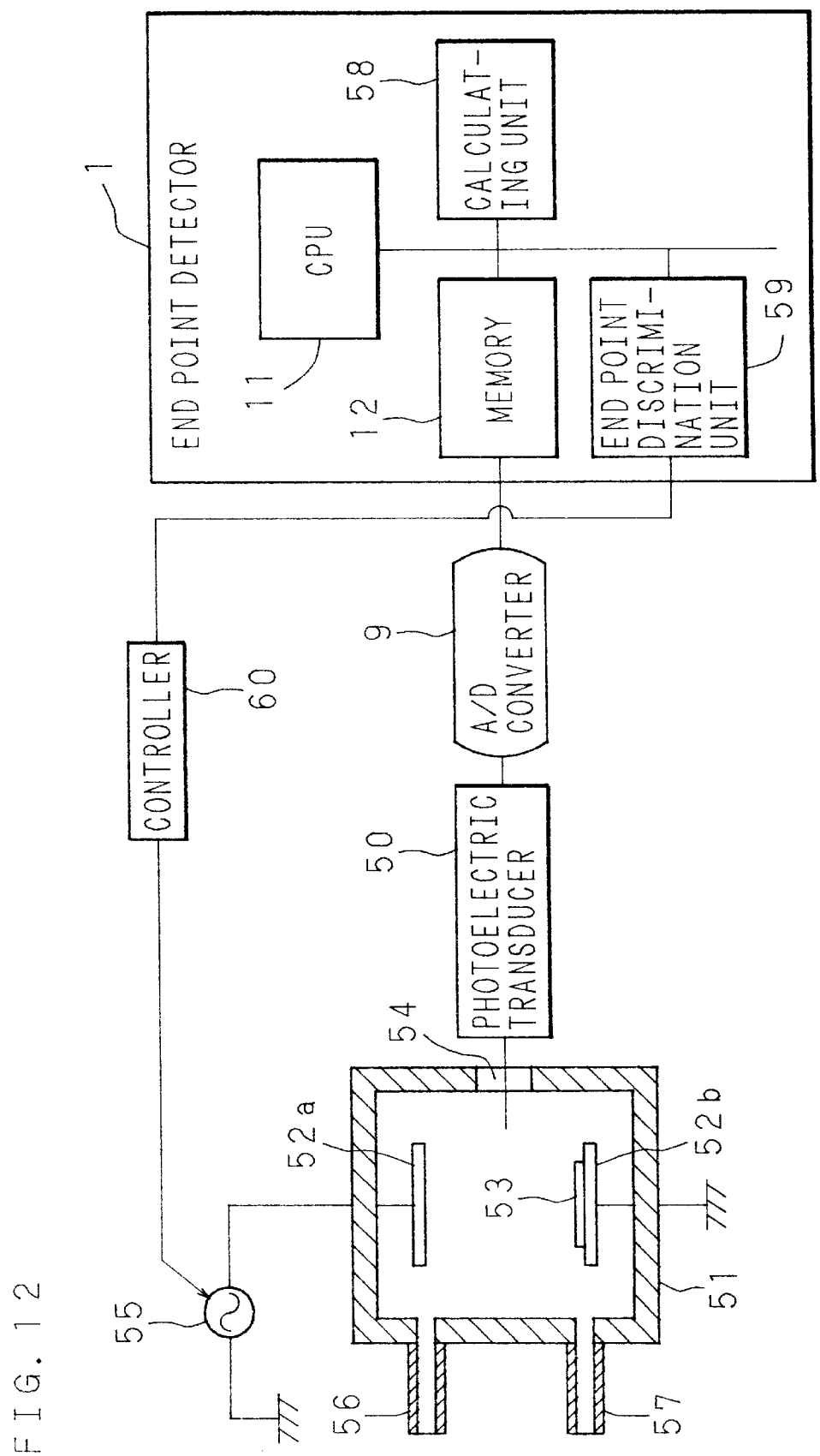
FIG. 12 is a diagram showing a block configuration of an etching apparatus in the application of the invention.

FIG. 12 is a block diagram showing an etching apparatus in the application of the invention. In FIG. 12, numeral 51 designates a vacuum processing chamber which is connected with an inlet pipe 56 for introducing the process gas and an exhaust pipe 57. The vacuum processing chamber 51 also has arranged therein an upper electrode 52a and a lower electrode 52b in opposed relation to each other. The upper electrode 52a is connected to a high-frequency power source 55, while the lower electrode 52b is grounded.

A detection window 54 is formed in the side wall of the vacuum processing chamber 51. The detection window 54 has on the outside thereof a photoelectric transducer 50 (photodiode, mono-chrometer, etc.), an A/D converter 9 and an end point detector 1 for detecting an etching end point on the basis of the amount of light changing with time. The photoelectric transducer 50 is for converting the plasma light of only a predetermined wavelength which passed through the detection window 54 into an electrical signal in accordance with the amount of light thereof. The A/D converter 9 converts the analog electrical signal obtained by the photoelectric transducer 50 into a digital signal. The end point detector 1 is adapted to detect an etching end point according to the digital signal. On a detection of the etching end point a controller 60 turns off the high-frequency power source 55.

A semiconductor substrate 53 is disposed on the lower electrode 52b in the vacuum processing chamber 51 that has been exhausted by way of the exhaust pipe 57, and a predetermined process gas is introduced into the vacuum processing chamber 51 through the inlet pipe 56. A high-frequency power is applied between the upper electrode 52a and the lower electrode 52b by the high-frequency power source 55, thereby etching the semiconductor substrate 53 by plasma. The plasma light generated during the etching process is passed through the detection window 54 and hence the passed light is photoelectrically converted into analog signals by the photoelectric transducer 50. The signals are converted into digital data by the A/D converter 9. The data obtained from the A/D converter 9 is used by the end point detector 1 to perform the arithmetic operation thereby to detect an etching end point. And the high-frequency power source 55 is turned off by the controller 60.

Figure 13:
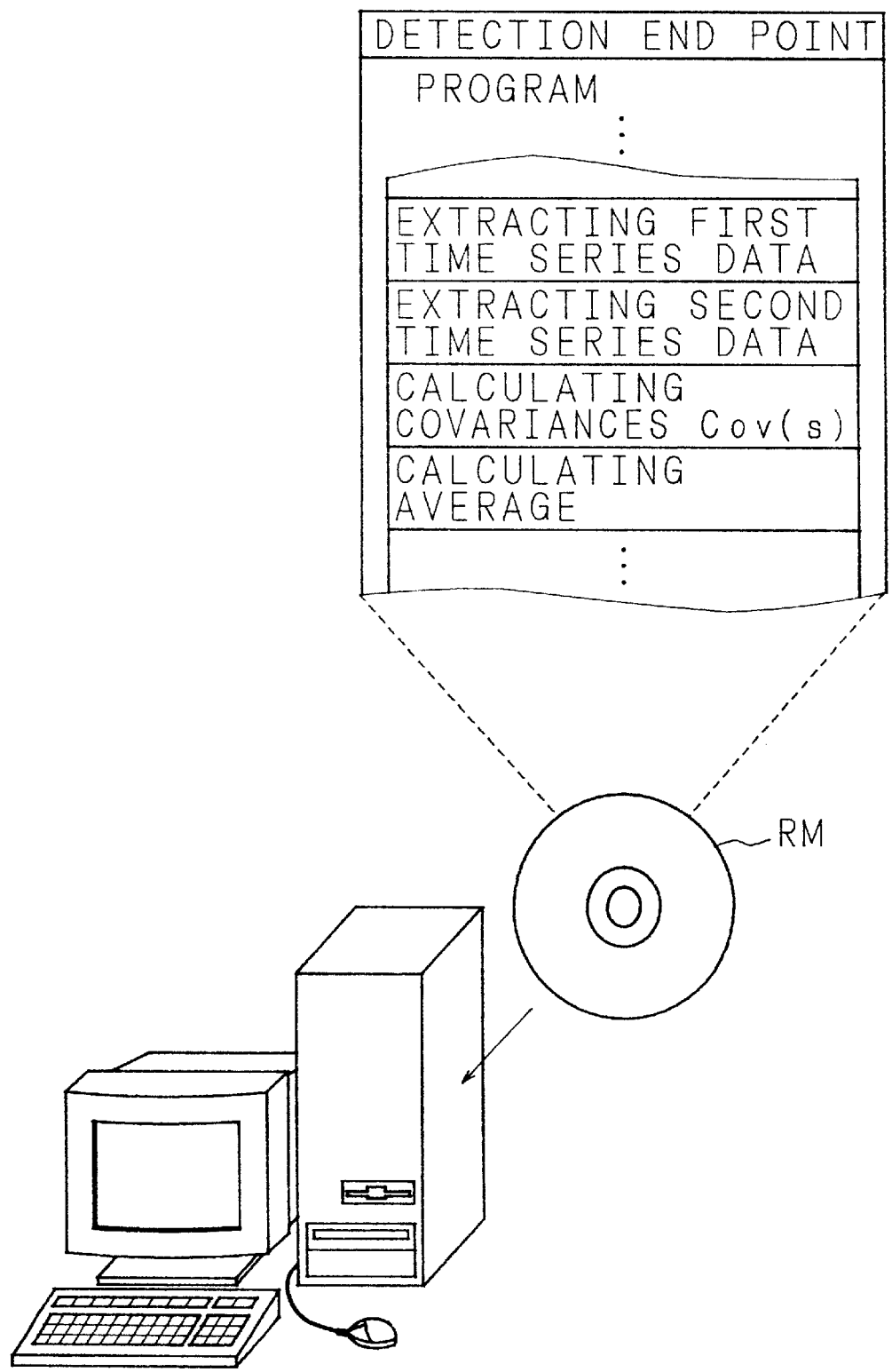
FIG. 13 is a schematic diagram for showing a computer memory product according to another embodiment.

A computer program for detecting an end point of a process in a manner as is shown in FIGS. 4 and 5, 7 and 8, or 10 and 11 can be written in a ROM for a computer having the structure as is shown in FIGS. 2, 6, 9 or 12 or alternatively, can be recorded in a recording medium (a computer memory product) RM such as a compact disk as is shown in FIG. 13. This computer memory product RM is mounted in a disk drive of a computer to be loaded, thereby detecting an end point of a process.

Now, specific results obtained by practicing the present invention will be described.

Example 1

Figure 14:
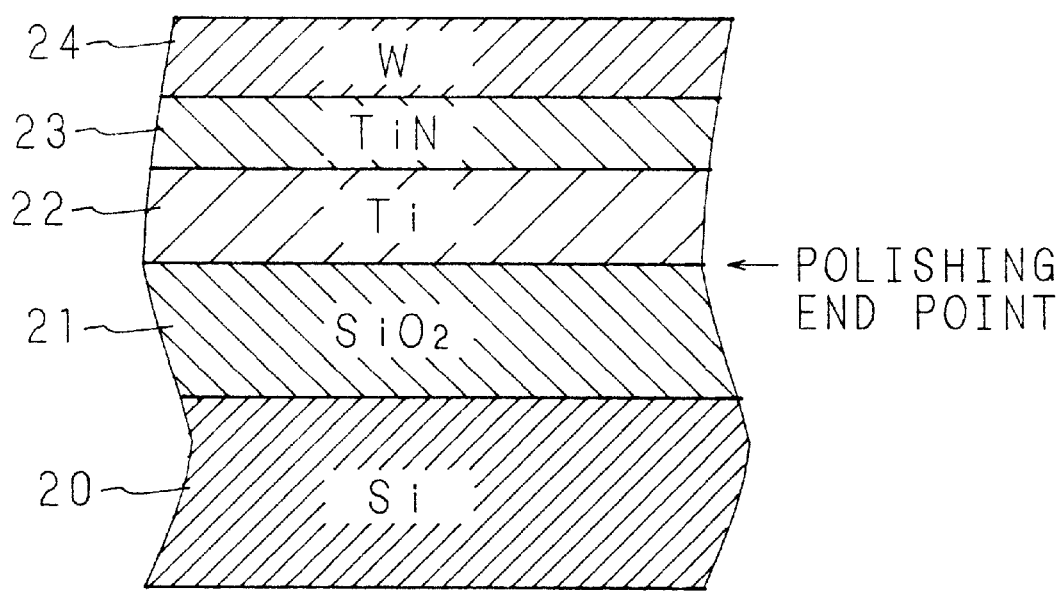
FIG. 14 is a side sectional view of a wafer used in an example of the invention.

FIG. 14 is a side sectional view of a wafer used in this example, in which a reference numeral 20 denotes a silicon substrate. On the silicon substrate 20, a $SiO_2$ film layer 21 is formed by, for example, a CVD device, and on the $SiO_2$ film layer 21, a Ti film layer 22 having a thickness of 600 Å, a TiN film layer 23 having a thickness of 1000 Å and a W film layer 24 having a thickness of 600 Å are stacked in this order. This wafer is to be polished by the CMP apparatus shown in FIG. 6 to the boundary between the $SiO_2$ film layer 21 and the Ti film layer 22, so as to confirm that the CMP apparatus can be halted through the detection of this polishing end point.

Figure 15:
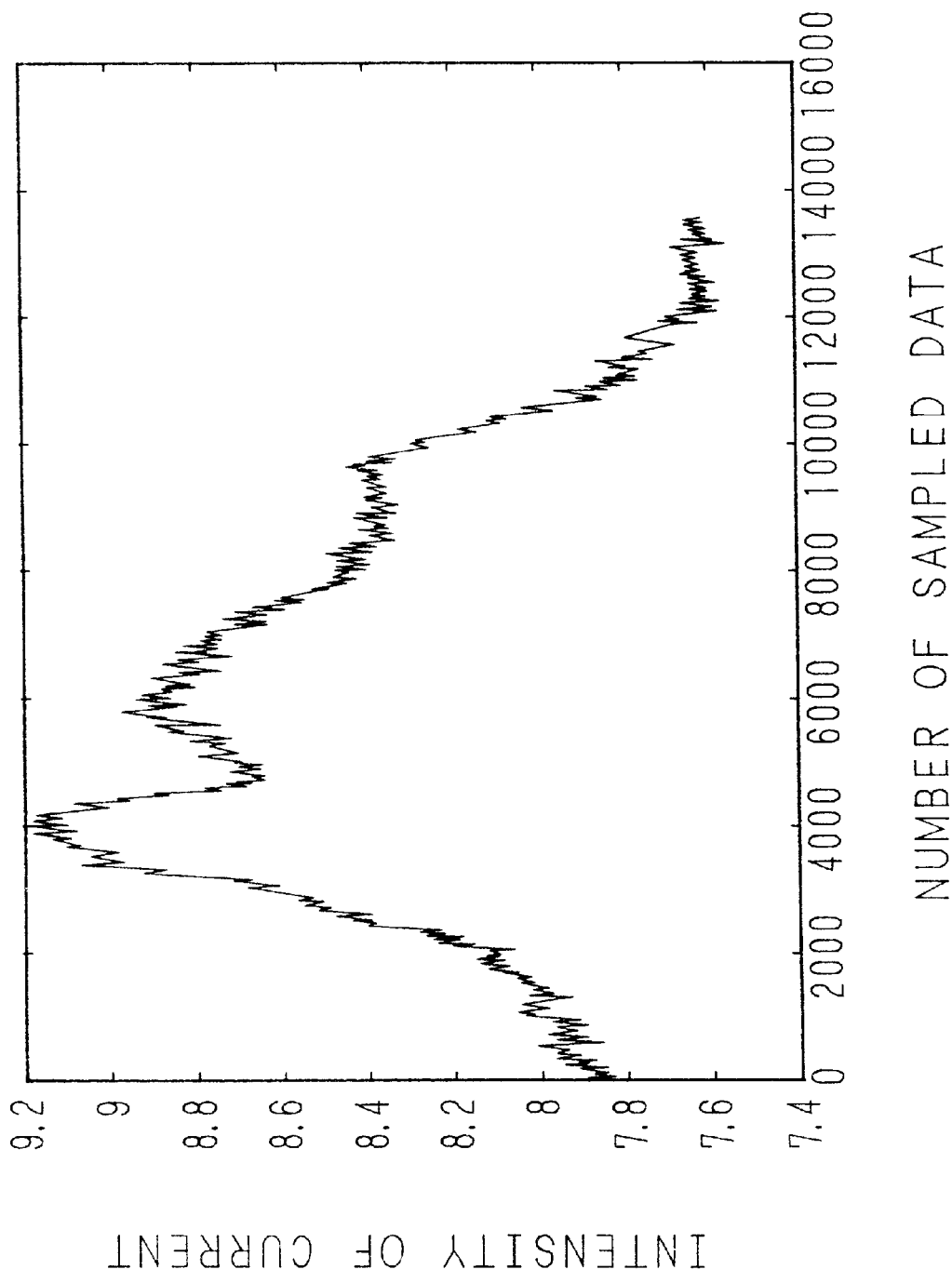
FIG. 15 is a graph for showing a current intensity supplied to the end point detector of the invention.

FIG. 15 is a graph for showing the intensity of a current supplied to the end point detector, wherein the ordinate indicates the intensity of the current and the abscissa indicates the number of sampled data. At this point, a sampling cycle is 10 msec., and for example, a 2000the data corresponds to one at 20000 msec. (=20 sec.) after the start of the sampling. As is obvious from FIG. 15, the intensity of the current supplied to the end point detector is varied with time in accordance with the change of the torque of the driving motor for polishing the wafer. In such time series data, the time regions are set with defining the time M as 4 sec. (corresponding to the number of sampled data of 400) and the time m as 2 sec. (corresponding to the number of sampled data of 200). In each of the time regions, the autocorrelation functions obtained when the delay times T are 30 through 180 msec. (corresponding to the numbers of sampled data of 3 through 18) are respectively calculated, and the average of the autocorrelation functions is defined as the autocorrelation function γ(s) of that time region.

Figure 16:
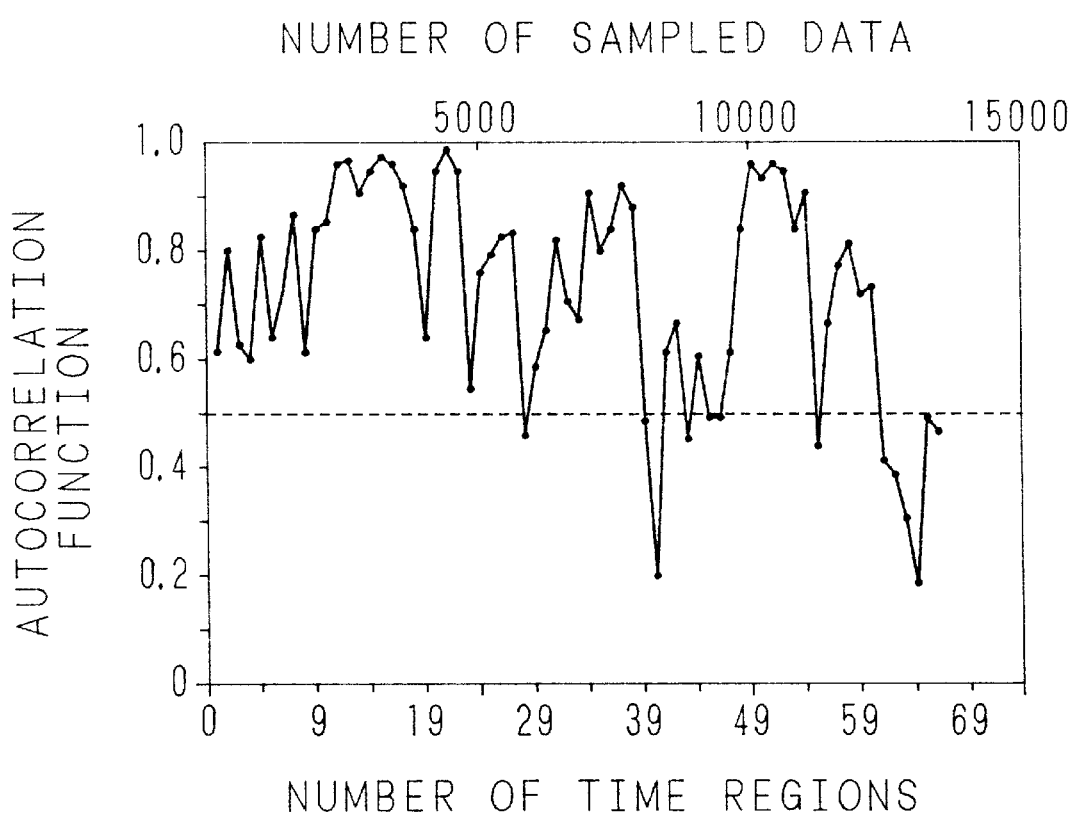
FIG. 16 is a graph for showing autocorrelation functions of plural time regions obtained by using time series data shown in FIG. 15.

FIG. 16 is a graph for showing the autocorrelation functions γ(s) of plural time regions obtained on the basis of the time series data of FIG. 15, wherein the ordinate indicates the autocorrelation function γ(s) and the abscissa indicates the number of the time regions. The graph of FIG. 16 is provided with the number of the sampled data at its upper portion for showing the correspondence to FIG. 15. As is obvious from FIGS. 14 and 15, a portion having a change in FIG. 15 has a value of the autocorrelation function γ(s) of 0.5 or more in FIG. 16, and a portion having no change in FIG. 15 has a value of the autocorrelation function γ(s) smaller than 0.5 in FIG. 16. Therefore, the EPD of each time region is obtained by defining the second threshold value $K_2$ as 0.5.

Figure 17:
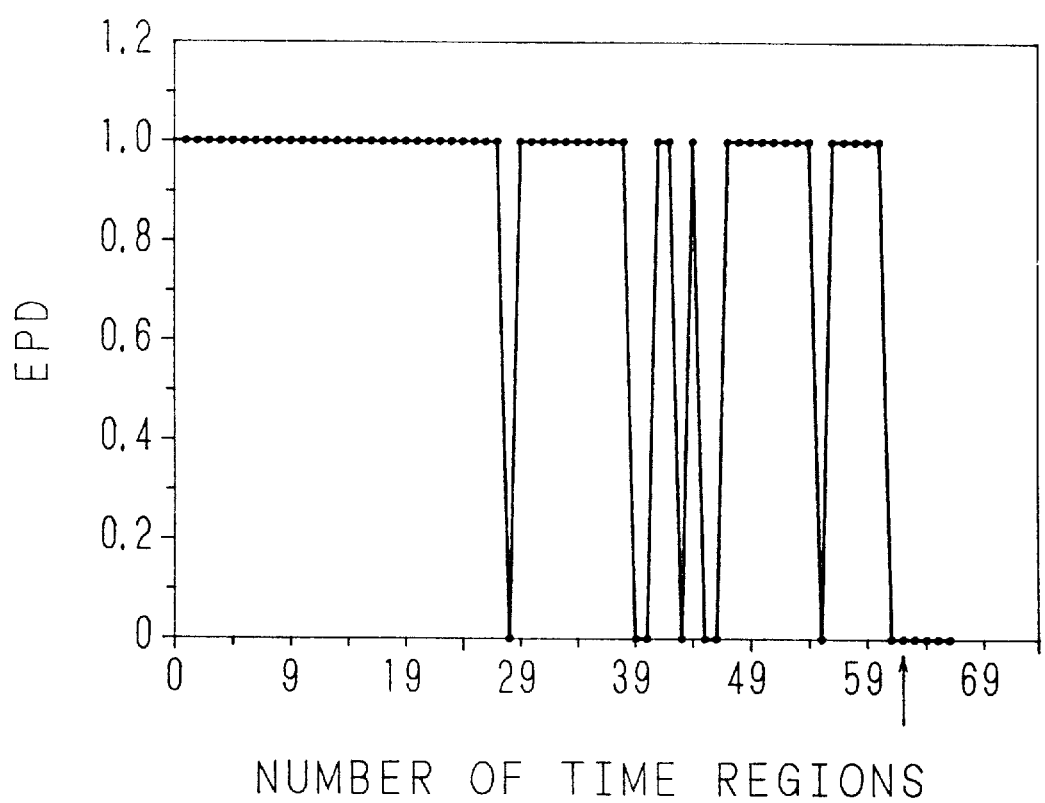
FIG. 17 is a graph of EPD obtained on the basis of the autocorrelation functions of FIG. 16.

FIG. 17 is a graph of the EPD obtained on the basis of the graph of FIG. 16, wherein the ordinate indicates the EPD and the abscissa indicates the number of the time regions. As is obvious from FIGS. 15 and 16, a portion having the autocorrelation function γ(s) exceeding 0.5 in FIG. 16 has the EPD of 1.0 in FIG. 17, and a portion having the autocorrelation function γ(s) smaller than 0.5 in FIG. 16 has the EPD of 0 in FIG. 17.

In this example, the end point detector is set to obtain the EPD from the 50th time region of FIG. 16 on the basis of the polishing speed and the thicknesses of the Ti film layer 22, the TiN film layer 23 and the W film layer 24. Therefore, the 50th time region of FIG. 16 actually corresponds to the 1st time region. In FIGS. 15 and 16, the time regions preceding the 50th time region are not used in the detection of the polishing end point, but the calculated autocorrelation functions γ(s) and EPI) of these time regions are shown in these graphs.

Then, a time region, after the 50th time region, at which the EPD is continuously set at 0 as is shown with an arrow in FIG. 17 is defined as the end point, and the CMP apparatus is halted in this time region. The wafer is taken out of the CMP apparatus, and the thus polished wafer is vertically cut, so that the section can be observed with an electron microscope. As a result, the Ti film layer 22 is found to have been completely removed.

Example 2

In this example, the result of detecting an end point of a polishing process on the wafer of FIG. 14 by using the end point detector of the third embodiment will be described.

Figure 18:
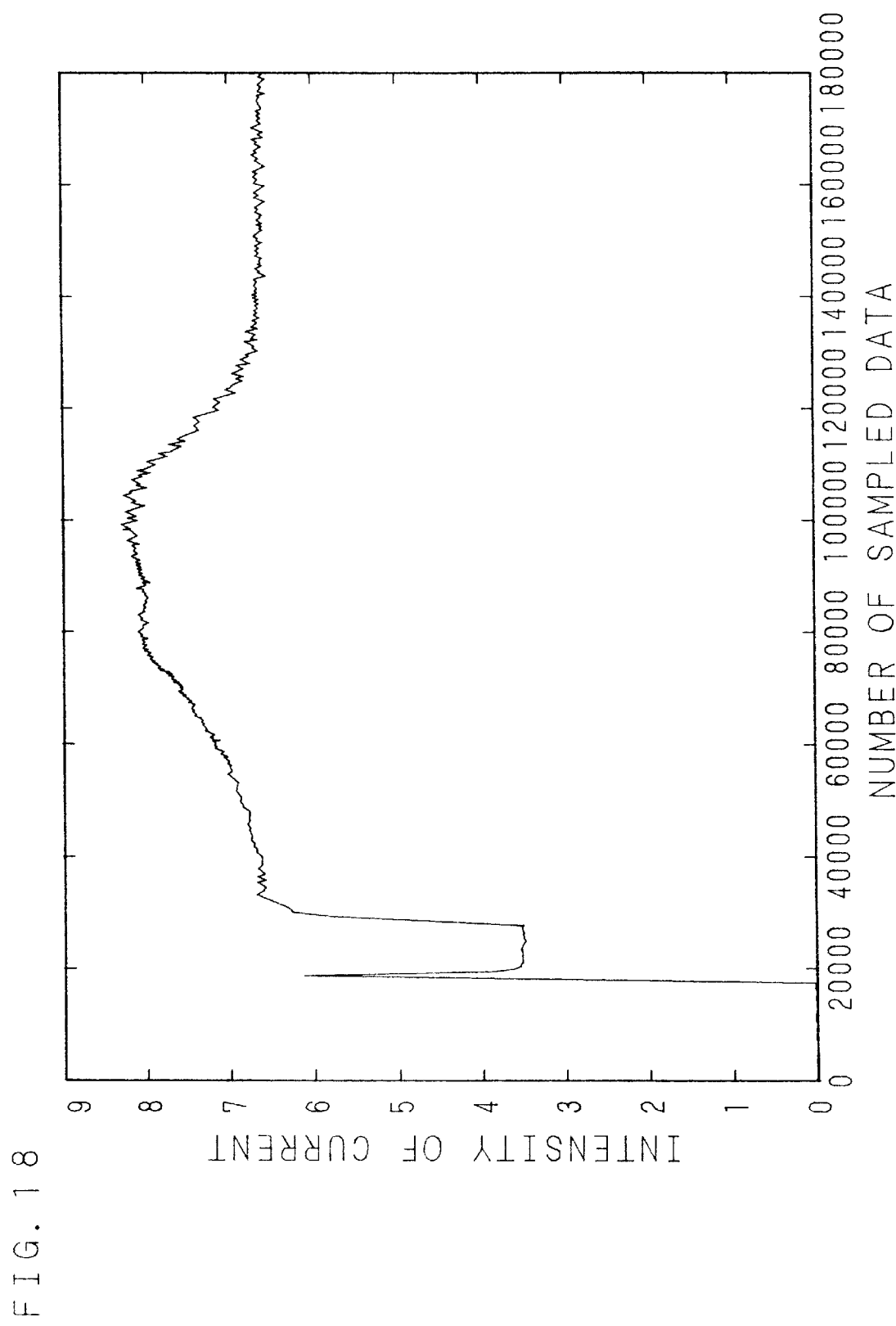
FIG. 18 is a graph for showing a current intensity supplied to the end point detector of FIG. 9.

FIG. 18 is a graph for showing the intensity of a current supplied to the end point detector 1 of FIG. 9, wherein the ordinate indicates the intensity of the current and the abscissa indicates the number of sampled data from the start of the measurement. In this case, the sampling cycle is 1 msec. As is shown in FIG. 18, the intensity of the current supplied to the end point detector 1 is changed with time in accordance with the change of the torque of the driving motor for polishing the wafer. In these time series data, the time regions are set with the time M defined as 4 msec. (corresponding to the number of sampled data of 4000) and the time m defined as 2 msec. (corresponding to the number of sampled data of 2000). In each of the time regions, the autocorrelation functions obtained when the delay times T are 3 through 18 msec. (corresponding to the numbers of sampled data of 3 through 18) are calculated and the average of the obtained autocorrelation functions is calculated as the autocorrelation function γ(s) of the time region.

Figure 19:
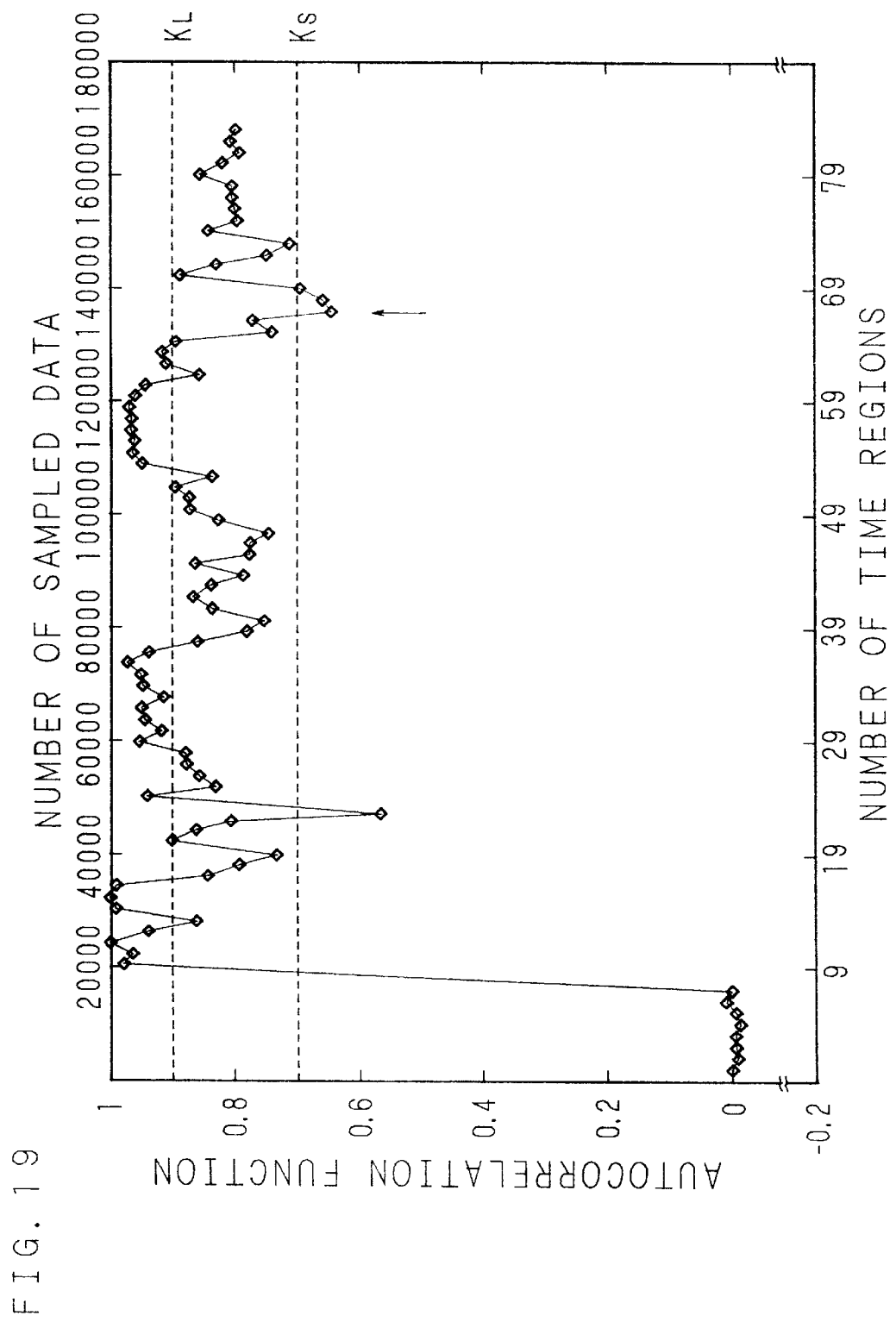
FIG. 19 is a graph for showing autocorrelation functions of plural time regions obtained by using time series data shown in FIG. 18.

FIG. 19 is a graph of the autocorrelation functions γ(s) of the plural time regions obtained on the basis of the time series data of FIG. 18, wherein the ordinate indicates the autocorrelation function γ(s) and the abscissa indicates the number of the time regions. The graph of FIG. 19 is provided with the number of the sampled data at its upper portion for the correspondence to FIG. 18. In FIG. 19, the time regions preceding the 40th time region are ignored in the end point detection, and on the basis of the autocorrelation functions γ(s) of the time regions following the 40th time region, the end point is detected by defining the larger threshold value $K_L$ as 0.9 and the smaller threshold value $K_S$ as 0.7. The autocorrelation function γ(s) exceeds the larger threshold value $K_L$ after the 50th time region, then decreases in a stepwise manner and becomes smaller than the smaller threshold value $K_s$ in a time region between the 65th and 70th time regions.

Then, a time region in which the autocorrelation function γ(s) becomes smaller than the smaller threshold value $K_S$ as is shown with an arrow in FIG. 19 is defined as the end point. At this end point, the CMP apparatus is halted, the wafer is taken out of the CMP apparatus, and the thus polished wafer is vertically cut so that the section can be observed with an electron microscope. As a result, the Ti film layer 22 is found to have been completely removed.

As described so far, according to the present invention, an end point can be detected by using a comparatively simple algorithm without performing frequency analysis, and hence, the end point can be detected in a short period of time and the cost of the device can be decreased. Moreover, since the end point is detected on the basis of the correlation between the first time series data and the second time series data, there is no need to previously conduct plural tests on, for example, the materials of respective films. Thus, the end point can be easily detected.

According to the present invention, since the plural second time series data delayed from the first time series data by plural different delay times are extracted, so as to obtain the correlations between the first time series data and the respective second time series data. Accordingly, the thus obtained correlations can be statistically processed, resulting in improving the accuracy in detecting the end point.

Furthermore, in the case where plural time regions are defined continuously along a time axis, there is a possibility of failing to detect an end point in the vicinity of a boundary between two adjacent time regions. However, according to the invention, the time regions are defined in the aforementioned manner, and hence, the end point can be prevented from being failed to be detected.

According to this invention, even in the case where, for example, a wafer in which plural films are stacked on a substrate is to be polished by using a chemical mechanical polishing apparatus, each of the first and second threshold values is not obtained with regard to the materials of the respective films but defined as one value in the entire polishing process. Therefore, the detection of the end point can be less troublesome.

In the present invention, it is possible to detect an end point by setting a third threshold value and a fourth threshold value (the third threshold value>the fourth threshold value) which are obtained as the larger and smaller threshold values determined in accordance with the covariance, or a fifth threshold value and a sixth threshold value (the fifth threshold value>the sixth threshold value) which are obtained as the larger and smaller threshold values determined in accordance with the autocorrelation function. After setting values, the end point of a process can be detected by detecting a time point at which a first value or a second value becomes smaller than the smaller threshold value after exceeding the larger threshold value. Even when a wafer on which plural films are stacked is to be polished by using a chemical mechanical polishing apparatus, these third through sixth threshold values are not obtained with regard to the materials of the respective films but can be defined in the entire polishing process. Accordingly, the end point detection can be less troublesome.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

Formula (1):

$$\text{Cov}(s) = \frac{1}{M-T} \sum_{t=1}^{M-T} (x(t) - \overline{x}_1)(x(t+T) - \overline{x}_2) \quad (1)$$

in Formla (1), however, $$\overline{x}_1 = \frac{1}{M-T} \sum_{t=1}^{M-1} x(t)$$

$$\overline{x}_2 = \frac{1}{M-T} \sum_{t=1}^{M-T} x(t+T)$$

Formula (2):

$$\gamma(s) = \frac{\text{Cov}(s)}{\sigma_1 \cdot \sigma_2} \quad (2)$$

Formla (2), however, $$\sigma_1 = \left\{ \frac{1}{M-T} \sum_{t=1}^{M-T} (x(t) - \overline{x}_1)^2 \right\}^{1/2}$$

$$\sigma_2 = \left\{ \frac{1}{M-T} \sum_{t=1}^{M-T} (x(t+T) - \overline{x}_2)^2 \right\}^{1/2}$$

What is claimed is:

1. A method of detecting an end point of a process in which a physical quantity changes during the process, comprising the steps of:
   obtaining time series data by measuring, with passage of time, the physical quantity changing during the process;
   extracting from the time series data, every time the time series data of a previously set time region are obtained, first time series data corresponding to a part of the time series data and second time series data delayed from the first time series data by a predetermined delay time;
   calculating correlation between the first time series data and the second time series data; and
   discriminating an end point of the process on the basis of a result of calculation.

2. The method of detecting an end point of a process according to claim 1,
   wherein a plurality of delay times are previously set,
   in the step of extracting, plural pairs of the first time series data and the second time series data are extracted from the time series data of one time region on the basis of the respective delay times, and
   in the step of calculating the correlation, correlations between the extracted pairs of the first time series data and the second time series data are obtained.

3. The method of detecting an end point of a process according to claim 1,
   wherein adjacent time regions overlap with each other.

4. The method of detecting an end point of a process according to claim 1,
   wherein the step of calculating the correlation includes a step of obtaining a first value corresponding to a covariance of the first time series data and the second time series data as the correlation relating to the both data, and
   the step of discriminating the end point includes a step of comparing the first value with a previously determined first threshold value.

5. The method of detecting an end point of a process according to claim 1,
   wherein the step of calculating the correlation includes:
      a step of obtaining a first value corresponding to a covariance of the first time series data and the second time series data as the correlation relating to the both data; and
      a step of calculating a second value corresponding to an autocorrelation function by using the first value, and
   the step of discriminating the end point includes a step of comparing the second value with a previously determined second threshold value.

6. The method of detecting an end point of a process according to claim 1,
   wherein the step of calculating the correlation includes a step of obtaining a first value corresponding to a covariance of the first time series data and the second time series data as the correlation relating to be both data,
   the step of discriminating the end point includes:
      a first comparison step of comparing the first value with a previously determined third threshold value;
      a step of storing a comparison result of the first comparison step when the first value is larger than the third threshold value in the first comparison step;
      a second comparison step of comparing the first value with a fourth threshold value smaller than the third threshold value; and
      a step of judging whether or not the comparison result of the first comparison step is stored when the first value is smaller than the fourth threshold value in the second comparison step.

7. The method of detecting an end point of a process according to claim 1,
   wherein the step of calculating the correlation includes:
      a step of obtaining a first value corresponding to a covariance of the first time series data and the second time series data as the correlation relating to the both data; and
      a step of calculating a second value corresponding to an autocorrelation function by using the first value, and
   the step of discriminating the end point includes:
      a first comparison step of comparing the second value with a previously determined fifth threshold value;
      a step of storing a comparison result of the first comparison step when the second value is larger than the fifth threshold value in the first comparison step;
      a second comparison step of comparing the second value with a sixth threshold value smaller than the fifth threshold value; and
      a step of judging whether or not the comparison result of the first comparison step is stored when the second value is smaller than the sixth threshold value.

8. A device for detecting an end point of a process in which a physical quantity changes during the process, comprising:
   means for obtaining time series data by measuring, with passage of time, the physical quantity changing during the process;

a memory for storing the time series data;

extracting means for extracting from the memory, every time the time series data of a previously set time region are stored in the memory, first time series data corresponding to a part of the time series data and second time series data delayed from the first time series data by a predetermined delay time;

calculating means for calculating correlation between the first time series data and the second time series data; and discriminating means for discriminating an end point of the process on the basis of a result of calculation by the calculating means.

9. The device for detecting an end point of a process according to claim 8, wherein a plurality of delay times are previously set in the extracting means, and the extracting means extracts plural pairs of first time series data and second time series data on the basis of the respective delay times, and supplies the extracted pairs of first and second time series data to the calculating means.

10. The device for detecting an end point of a process according to claim 8, wherein the extracting means extracts the first time series data and the second time series data with adjacent time regions overlapping with each other.

11. The device for detecting an end point of a process according to claim 8, wherein the calculating means includes means for obtaining a first value corresponding to a covariance of the first time series data and the second time series data, and the discriminating means includes means for comparing the first value with a previously determined first threshold value.

12. The device for detecting an end point of a process according to claim 8, wherein the calculating means includes:
means for obtaining a first value corresponding to a covariance of the first time series data and the second time series data; and means for calculating a second value corresponding to an autocorrelation function by using the first value, and the discriminating means includes means for comparing the second value with a previously determined second threshold value.

13. The device for detecting an end point of a process according to claim 8, wherein the calculating means includes means for obtaining a first value corresponding to a covariance of the first time series data and the second time series data, and the discriminating means includes:
means for comparing the first value with a previously determined third threshold value;

storing means for storing a comparison result when the first value is larger than the third threshold value;

means for comparing the first value with a fourth threshold value smaller than the third threshold value; and means for judging whether or not the comparison result is stored in the storing means when the first value is smaller than the fourth threshold value.

14. The device for detecting an end point of a process according to claim 8, wherein the calculating means includes:
means for obtaining a first value corresponding to a covariance of the first time series data and the second time series data; and means for calculating a second value corresponding to an autocorrelation function by using the first value, and the discriminating means includes;
means for comparing the second value with a previously determined fifth threshold value;

storing means for storing a comparison result when the second value is larger than the fifth threshold value;

means for comparing the second value with a sixth threshold value smaller than the fifth threshold value; and means for judging whether or not the comparison result is stored in the storing means when the second value is smaller than the sixth threshold value.

15. A computer memory product for detecting an end point of a process in which a physical quantity changes during the process, comprising:

a computer usable storage medium having computer readable program code means, the computer readable program code means including:

first computer readable program code means for causing the computer to store time series data obtained by measuring, with passage of time, the physical quantity in a memory;

second computer readable program code means for causing the computer to extract from the memory, every time the time series data of a previously set time region are stored in the memory, first time series data corresponding to a part of the time series data and second time series data delayed by a predetermined delay time from the first time series data;

third computer readable program code means for causing the computer to calculate correlation between the first time series data and the second time series data; and fourth computer readable program code means for causing the computer to discriminate an end point of the process on the basis of a result of calculation.

16. The computer memory product according to claim 15, wherein a plurality of delay times are previously set in the second computer readable program code means, the second computer readable program code means causes the computer to extract, from the time series data of one time region, plural pairs of first time series data and second time series data on the basis of the respective delay times, and the third computer readable program code means causes the computer to obtain correlations between the extracted pairs of the first time series data and the second time series data.

17. The computer memory product according to claim 15, wherein the second computer readable program code means causes the computer to extract the first time series data and the second time series data with adjacent time regions overlapping with each other.

18. The computer memory product according to claim 15, wherein the third computer readable program code means includes program code means for causing the computer to obtain a first value corresponding to a covariance of the first time series data and the second time series data, and the fourth computer readable program code means includes program code means for causing the computer to compare the first value with a previously determined first threshold value.

19. The computer memory product according to claim 15, wherein the third computer readable program code means includes:
program code means for causing the computer to obtain a first value corresponding to a covariance of the first time series data and the second time series data; and
program code means for causing the computer to calculate a second value corresponding to an auto-correlation function by using the first value, and
the fourth computer readable program code means includes program code means for causing the computer to compare the second value with a previously determined second threshold value.

20. The computer memory product according to claim 15, wherein the third computer readable program code means includes program code means for causing the computer to obtain a first value corresponding to a covariance of the first time series data and the second time series data, and
the fourth computer readable program code means includes:
program code means for causing the computer to compare the first value with a previously determined third threshold value;
program code means for causing the computer to store a comparison result when the first value is larger than the third threshold value;
program code means for causing the computer to compare the first value with a fourth threshold value smaller than the third threshold value; and
program code means for causing the computer to judge whether or not the comparison result that the first value is larger than the third threshold value is stored when the first value is smaller than the fourth threshold value.

21. The computer memory product according to claim 15, wherein the third computer readable program code means includes:
program code means for causing the computer to obtain a first value corresponding to a covariance of the first time series data and the second time series data; and
program code means for causing the computer to calculate a second value corresponding to an auto-correlation function by using the first value, and
the fourth computer readable program code means includes:
program code means for causing the computer to compare the second value with a previously determined fifth threshold value;
program code means for causing the computer to store a comparison result when the second value is larger than the fifth threshold value;
program code means for causing the computer to compare the second value with a sixth threshold value smaller than the fifth threshold value; and
program code means for causing the computer to determine whether or not the comparison result that the second value is larger than the fifth threshold value is stored when the second value is smaller than the sixth threshold value.

22. A device according to claim 8 further comprising:
a table for placing an object to be polished;
a polishing table disposed to oppose the table and provided with a polishing cloth;
a motor mounted on the table and/or the polishing table for causing a relative movement between the table and the polishing table; and
control means for controlling the motor to halt chemical mechanical polishing when the discriminating means discrimination the end point of the process.

\* \* \* \* \*